United States Patent
Srinivasan et al.

(10) Patent No.: US 7,417,881 B2
(45) Date of Patent: Aug. 26, 2008

(54) LOW POWER CONTENT ADDRESSABLE MEMORY

(75) Inventors: Varadarajan Srinivasan, Los Altos Hills, CA (US); Sandeep Khanna, Los Altos, CA (US); Bindiganavale S. Nataraj, Cupertino, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 16 days.

(21) Appl. No.: 11/557,098

(22) Filed: Nov. 6, 2006

(65) Prior Publication Data

US 2007/0064461 A1    Mar. 22, 2007

Related U.S. Application Data

(63) Continuation of application No. 10/713,185, filed on Nov. 15, 2003, now Pat. No. 7,133,302.

(51) Int. Cl.
    *G11C 27/00* (2006.01)
(52) U.S. Cl. ............... 365/45; 365/49; 365/189.07; 365/185.17; 365/230.06; 365/168; 365/189.01; 365/230.01
(58) Field of Classification Search ............ 365/45, 365/49, 189.07, 185.17, 230.06, 189.08, 365/189.04, 191
See application file for complete search history.

(56) References Cited

U.S. PATENT DOCUMENTS

| | | | |
|---|---|---|---|
| 5,568,415 A | 10/1996 | McLellan et al. | |
| 6,081,440 A | 6/2000 | Washburn et al. | |
| 6,101,115 A | 8/2000 | Ross | |
| 6,108,227 A * | 8/2000 | Voelkel | 365/49.17 |
| 6,137,707 A | 10/2000 | Srinivasan et al. | |
| 6,154,384 A * | 11/2000 | Nataraj et al. | 365/49.15 |
| 6,163,473 A | 12/2000 | Hannum | |
| 6,169,685 B1 | 1/2001 | Gandini et al. | |
| 6,275,406 B1 | 8/2001 | Gibson et al. | |
| 6,288,922 B1 | 9/2001 | Wong et al. | |
| 6,353,332 B1 | 3/2002 | Brelet | |
| 6,385,071 B1 | 5/2002 | Chai et al. | |
| 6,584,003 B1 | 6/2003 | Kim et al. | |
| 6,647,457 B1 | 11/2003 | Sywyk et al. | |
| 6,697,275 B1 | 2/2004 | Sywyk et al. | |
| 6,901,000 B1 * | 5/2005 | Ichiriu et al. | 365/49 |
| 7,016,243 B1 | 3/2006 | Srinivasan et al. | |
| 7,035,968 B1 * | 4/2006 | Pereira | 711/108 |
| 7,057,913 B2 * | 6/2006 | Hsu et al. | 365/49 |
| 2002/0161969 A1 | 10/2002 | Nataraj et al. | |
| 2005/0050408 A1 | 3/2005 | Kaginele | |

* cited by examiner

*Primary Examiner*—Dang T Nguyen
(74) *Attorney, Agent, or Firm*—Shemwell Mahamedi LLP

(57) ABSTRACT

A low power content addressable memory (CAM) device. The CAM device receives an N-bit comparand value and, in response, activates less than N compare lines within the CAM device to compare each of the N bits of the comparand value with contents of CAM cells coupled to the N compare lines.

11 Claims, 17 Drawing Sheets

PRIOR-ART

| MSEL 0=SM, 1=XY | DM[3:0] M₁ | D₁ | M₀ | D₀ | D_EQ | Mapped Data D_S3/Y₁ | D_S2/X₁ | D_S1/Y₀ | D_S0/X₀ | CE[1:0]=11 CDEC | RES | CE[1:0]=10 CDEC | RES | CE[1:0]=01 CDEC | RES | CE[1:0]=00 CDEC | RES |
|---|---|---|---|---|---|---|---|---|---|---|---|---|---|---|---|---|---|
| 0 | 0 | 0 | 0 | 0 | 00 | 0 | 0 | 0 | 1 | 1000 | F | 0100 | F | 0010 | F | 0001 | M |
| 0 | 0 | 0 | 0 | 1 | 01 | 0 | 0 | 1 | 0 | 1000 | F | 0100 | F | 0010 | M | 0001 | F |
| 0 | 0 | 0 | 1 | X | 0X | 0 | 0 | 1 | 1 | 1000 | F | 0100 | F | 0010 | M | 0001 | M |
| 0 | 0 | 1 | 0 | 0 | 10 | 0 | 1 | 0 | 0 | 1000 | F | 0100 | M | 0010 | F | 0001 | F |
| 0 | 0 | 1 | 0 | 1 | 11 | 1 | 1 | 0 | 0 | 1000 | M | 0100 | F | 0010 | F | 0001 | F |
| 0 | 0 | 1 | 1 | X | 1X | 1 | 0 | 1 | 1 | 1000 | F | 0100 | M | 0010 | F | 0001 | F |
| 0 | 1 | X | 0 | 0 | X0 | 1 | 1 | 0 | 0 | 1000 | M | 0100 | M | 0010 | F | 0001 | M |
| 0 | 1 | X | 0 | 1 | X1 | 1 | 1 | 1 | 0 | 1000 | M | 0100 | F | 0010 | M | 0001 | F |
| 0 | 1 | X | 1 | X | XX | 1 | 1 | 1 | 1 | 1000 | M | 0100 | M | 0010 | M | 0001 | M |
| 1 | 0 | 0 | 0 | 0 | 00 | 0 | 0 | 0 | 0 | 0101 | F | 0110 | F | 1001 | F | 1010 | M |
| 1 | 0 | 0 | 0 | 1 | 01 | 0 | 0 | 0 | 1 | 0101 | F | 0110 | F | 1001 | M | 1010 | F |
| 1 | 0 | 0 | 1 | X | 0X | 0 | 0 | 1 | 0 | 0101 | F | 0110 | M | 1001 | M | 1010 | M |
| 1 | 0 | 1 | 0 | 0 | 10 | 0 | 1 | 1 | 1 | 0101 | M | 0110 | F | 1001 | F | 1010 | F |
| 1 | 0 | 1 | 0 | 1 | 11 | 0 | 1 | 0 | 1 | 0101 | F | 0110 | M | 1001 | F | 1010 | F |
| 1 | 0 | 1 | 1 | X | 1X | 0 | 1 | 0 | 0 | 0101 | F | 0110 | M | 1001 | F | 1010 | F |
| 1 | 1 | X | 0 | 0 | X0 | 0 | 0 | 0 | 1 | 0101 | M | 0110 | F | 1001 | M | 1010 | M |
| 1 | 1 | X | 0 | 1 | X1 | 0 | 0 | 1 | 0 | 0101 | M | 0110 | M | 1001 | F | 1010 | F |
| 1 | 1 | X | 1 | X | XX | 0 | 0 | 0 | 0 | 0101 | M | 0110 | M | 1001 | M | 1010 | M |

450

| Row | MSEL 0=SM,1=XY | Stored Data | | | | Read Data | | | | |
|---|---|---|---|---|---|---|---|---|---|---|
| | | $D_{S3}/Y_1$ | $D_{S2}/X_1$ | $D_{S1}/Y_0$ | $D_{S0}/X_0$ | $M_1$ | $D_1$ | $M_0$ | $D_0$ | $D_{EQ}$ |
| 1 | 0 | 0 | 0 | 0 | 1 | 0 | 0 | 0 | 0 | 00 |
| 2 | 0 | 0 | 0 | 1 | 0 | 0 | 0 | 0 | 1 | 01 |
| 3 | 0 | 0 | 1 | 0 | 0 | 0 | 1 | 0 | 0 | 10 |
| 4 | 0 | 1 | 0 | 1 | 1 | 0 | 1 | 0 | 1 | 11 |
| 5 | 0 | 0 | 0 | 0 | 0 | 0 | 0 | 1 | 0 | 0X |
| 6 | 0 | 1 | 1 | 0 | 1 | 0 | 1 | 1 | 0 | 1X |
| 7 | 0 | 0 | 1 | 0 | 0 | 1 | 0 | 0 | 0 | X0 |
| 8 | 0 | 1 | 1 | 1 | 1 | 1 | 0 | 0 | 1 | X1 |
| 9 | 0 | 1 | 0 | 1 | 0 | 1 | 0 | 1 | 0 | XX |
| 10 | 1 | 0 | 1 | 1 | 1 | 0 | 0 | 0 | 0 | 00 |
| 11 | 1 | 1 | 0 | 0 | 0 | 0 | 0 | 0 | 1 | 01 |
| 12 | 1 | 0 | 1 | 0 | 0 | 0 | 1 | 0 | 0 | 10 |
| 13 | 1 | 0 | 0 | 0 | 0 | 0 | 1 | 0 | 1 | 11 |
| 14 | 1 | 0 | 1 | 1 | 1 | 0 | 0 | 1 | 0 | 0X |
| 15 | 1 | 1 | 0 | 0 | 0 | 0 | 0 | 1 | 0 | 1X |
| 16 | 1 | 0 | 0 | 0 | 1 | 1 | 0 | 0 | 0 | X0 |
| 17 | 1 | 0 | 0 | 0 | 0 | 1 | 0 | 0 | 1 | X1 |
| 18 | 1 | 0 | 0 | 0 | 0 | 1 | 0 | 1 | 0 | XX |

| Row | BYP | M₁ | D₁ | M₀ | D₀ | D_EQ | Match on CE or A-B States | D_S3 | D_S2 | D_S1 | D_S0 | CE[1:0]=11 CDEC | RES | CE[1:0]=10 CDEC | RES | CE[1:0]=01 CDEC | RES | CE[1:0]=00 CDEC | RES |
|---|---|---|---|---|---|---|---|---|---|---|---|---|---|---|---|---|---|---|---|
| 1 | 0 | 0 | 0 | 0 | 0 | 00 | S0 | 0 | 0 | 0 | 1 | 1000 | F | 0100 | F | 0010 | F | 0001 | M |
| 2 | 0 | 0 | 0 | 0 | 1 | 01 | S1 | 0 | 0 | 1 | 0 | 1000 | F | 0100 | F | 0010 | M | 0001 | F |
| 3 | 0 | 0 | 0 | 1 | X | 0X | S0+S1 | 0 | 0 | 1 | 1 | 1000 | F | 0100 | F | 0010 | M | 0001 | M |
| 4 | 0 | 0 | 0 | 1 | 0 | 10 | S2 | 0 | 1 | 0 | 0 | 1000 | F | 0100 | M | 0010 | F | 0001 | F |
| 5 | 0 | 0 | 0 | 1 | 1 | 11 | S3 | 1 | 0 | 0 | 0 | 1000 | M | 0100 | F | 0010 | F | 0001 | F |
| 6 | 0 | 0 | 0 | 1 | X | 1X | S2+S3 | 1 | 1 | 0 | 0 | 1000 | M | 0100 | M | 0010 | F | 0001 | F |
| 7 | 0 | 0 | X | 0 | 0 | X0 | S0+S2 | 0 | 1 | 0 | 1 | 1000 | F | 0100 | M | 0010 | F | 0001 | M |
| 8 | 0 | 0 | X | 0 | 1 | X1 | S1+S3 | 1 | 0 | 1 | 0 | 1000 | M | 0100 | F | 0010 | M | 0001 | F |
| 9 | 0 | 0 | X | 1 | X | XX | S0+S1+S2+S3 | 1 | 1 | 1 | 1 | 1000 | M | 0100 | M | 0010 | M | 0001 | M |
| 10 | 1 | 0 | 0 | 0 | 0 | -- | FALSE | 0 | 0 | 0 | 0 | 1000 | F | 0100 | F | 0010 | F | 0001 | F |
| 11 | 1 | 0 | 0 | 0 | 1 | -- | /A*/B | 0 | 0 | 0 | 1 | 1000 | F | 0100 | F | 0010 | F | 0001 | M |
| 12 | 1 | 0 | 0 | 1 | 0 | -- | /A*B | 0 | 0 | 1 | 0 | 1000 | F | 0100 | F | 0010 | M | 0001 | F |
| 13 | 1 | 0 | 0 | 1 | 1 | -- | /A | 0 | 0 | 1 | 1 | 1000 | F | 0100 | F | 0010 | M | 0001 | M |
| 14 | 1 | 0 | 1 | 0 | 0 | -- | A*/B | 0 | 1 | 0 | 0 | 1000 | F | 0100 | M | 0010 | F | 0001 | F |
| 15 | 1 | 0 | 1 | 0 | 1 | -- | /B | 0 | 1 | 0 | 1 | 1000 | F | 0100 | M | 0010 | F | 0001 | M |
| 16 | 1 | 0 | 1 | 1 | 0 | -- | A⊕B | 0 | 1 | 1 | 0 | 1000 | F | 0100 | M | 0010 | M | 0001 | F |
| 17 | 1 | 0 | 1 | 1 | 1 | -- | /A+/B | 0 | 1 | 1 | 1 | 1000 | F | 0100 | M | 0010 | M | 0001 | M |
| 18 | 1 | 1 | 0 | 0 | 0 | -- | A*B | 1 | 0 | 0 | 0 | 1000 | M | 0100 | F | 0010 | F | 0001 | F |
| 19 | 1 | 1 | 0 | 0 | 1 | -- | /(A⊕B) | 1 | 0 | 0 | 1 | 1000 | M | 0100 | F | 0010 | F | 0001 | M |
| 20 | 1 | 1 | 0 | 1 | 0 | -- | B | 1 | 0 | 1 | 0 | 1000 | M | 0100 | F | 0010 | M | 0001 | F |
| 21 | 1 | 1 | 0 | 1 | 1 | -- | /A+B | 1 | 0 | 1 | 1 | 1000 | M | 0100 | F | 0010 | M | 0001 | M |
| 22 | 1 | 1 | 1 | 0 | 0 | -- | A | 1 | 1 | 0 | 0 | 1000 | M | 0100 | M | 0010 | F | 0001 | F |
| 23 | 1 | 1 | 1 | 0 | 1 | -- | A+/B | 1 | 1 | 0 | 1 | 1000 | M | 0100 | M | 0010 | F | 0001 | M |
| 24 | 1 | 1 | 1 | 1 | 0 | -- | A+B | 1 | 1 | 1 | 0 | 1000 | M | 0100 | M | 0010 | M | 0001 | F |
| 25 | 1 | 1 | 1 | 1 | 1 | -- | TRUE | 1 | 1 | 1 | 1 | 1000 | M | 0100 | M | 0010 | M | 0001 | M |

540

LOW POWER CONTENT ADDRESSABLE MEMORY

CROSS REFERENCE TO RELATED APPLICATIONS

This application is a continuation, and hereby incorporates by reference, U.S. patent application Ser. No. 10/713,185 filed Nov. 15, 2003 now U.S. Pat. No. 7,133,302 and entitled "Low Power Content Addressable Memory."

FIELD OF THE INVENTION

The present invention relates generally to content addressable memory devices, and more particularly to read, write and compare operations within content addressable memory devices.

BACKGROUND

Content addressable memory (CAM) devices are often used in network switching and routing applications to determine forwarding destinations for data packets. A CAM device can be instructed to compare a selected portion of an incoming packet, typically a destination field within the packet header, with data values, called CAM words, stored in an associative storage array within the CAM device. If the destination field matches a CAM word, the CAM device generates a match address that identifies the location of the matching CAM word within the storage array, and asserts a match flag to signal the match. The match address is then typically used to index another storage array, either within or separate from the CAM device, to retrieve a destination address or other routing information for the packet.

FIG. 1 illustrates a portion of a prior-art CAM device 100, including an associative storage array 101 and comparand driver 103. The associative storage array 101, commonly referred to as a CAM array, is populated with CAM cells 12 arranged in rows and columns. Precharged match lines (ML) are coupled to respective rows of the CAM cells, and bit line pairs (BL and /BL) and compare line pairs (CL and /CL) are coupled to respective columns of the CAM cells. Collectively, the bit line pairs form a data port for read/write access to address-selected rows of CAM cells, and the compare line pairs form a compare port for inputting comparand values to the CAM array 101 during compare operations. The CAM cells themselves are specialized store-and-compare circuits each having a storage element to store a constituent bit of a CAM word presented on the bit lines and a compare circuit for comparing the stored bit with a comparand bit presented on the compare lines. In a typical arrangement, the compare circuits within the CAM cells of a given row are coupled in parallel to the match line for the row, with each compare circuit switchably forming a discharge path to discharge the match line if the stored bit and comparand bit do not match. By this arrangement, if any one bit of a CAM word does not match the corresponding bit of the comparand value, the match line for the row is discharged to signal the mismatch condition. If all the bits of the CAM word match the corresponding bits of the comparand value, the match line remains in its precharged state to signal a match. Because a comparand value is presented to all the rows of CAM cells in each compare operation, a rapid, parallel search for a matching CAM word is performed.

Still referring to FIG. 1, an expanded view of a prior-art CAM cell 12 is shown at 112. The CAM cell 12 includes a bi-stable storage circuit 117 (MEM) coupled to a compare circuit 119. The compare circuit 119 includes two pairs of transistors T1/T2 and T3/T4, each coupled in series between a match line (ML) and ground. Gate terminals of transistors T1 and T3 are coupled to the compare lines CL and /CL to receive a comparand bit, C, and complement comparand bit, /C, respectively, and gate terminals of transistors T4 and T2 are coupled to non-inverting and inverting inputs of the storage circuit 117 to receive a data bit, D, and complement data bit, /D, respectively. By this arrangement, when the comparand bit and data bit do not match (i.e., C=0, D=1 or C=1, D=0), a path between the match line and ground is formed between one of the series-coupled transistor pairs, T1/T2 or T3/T4, thereby discharging the match line to signal the mismatch condition. By contrast, if the comparand bit matches the data bit, at least one transistor in each series-coupled transistor pair, T1/T2 and T3/T4, will be switched off so that the match line is isolated from ground within the CAM cell.

Advances in CAM design and semiconductor process technology have enabled increased storage density and compare throughput in each new generation of CAM devices, with modern devices having several hundred thousand CAM cells and the ability to perform hundreds of millions of searches per second, or more. As storage density and compare throughput increase, however, so do power consumption and heat generation. Thermal constraints have emerged as a potentially limiting factor in meeting demands for increased storage density and compare throughput in future generations of CAM devices.

The circuits that charge and discharge the relatively high-capacitance match lines and compare lines are typically the dominant power consumers within a modern CAM device, consuming up to 70% or more of the total power budget. Referring to the prior-art CAM device 100, for example, at the completion of each compare operation, all the compare lines are discharged to enable the match lines to be precharged in preparation for the next compare operation. Then, at the start of the next compare operation, the compare line drivers 103 drive each pair of compare lines to complementary high and low states according to the state of the corresponding bit of comparand value 102. Thus, half the compare lines transition from low to high logic states during each compare operation; a substantial power consumption that increases with compare cycle frequency. A secondary effect of the compare line transitions is a dynamic, capacitive loading of the match lines which, in turn, causes the precharged level of the match lines to temporarily drop (i.e., glitch). Referring to the detailed view of CAM cell 12, for example, if compare lines CL and /CL are initially discharged (i.e., to enable the match line, ML, to be precharged), and transistor T4 is switched off (i.e., D=0), then the isolated drain of transistor T4 will float between logic low and high voltages. Consequently, if comparand line /CL is transitioned to a logic high state in the ensuing compare operation (i.e., C=0; a match condition), then a small charging current will flow through transistor T3 to charge the floating drain node of transistor T4 to a logic high level. A corresponding charging current flows through transistor T1 to charge the floating drain node of transistor T2 when D=C=1. Thus, in a match condition, the drain node of transistor T2 or transistor T4 constitutes a parasitic capacitance, illustrated in the detail view 112 by dashed capacitor symbols, which is charged by a small, parasitic current drawn from the match line. If a mismatch occurs within a cell within a given CAM row (i.e., row of CAM cells), the match line is discharged in any event, so that any parasitic currents drawn by other CAM cells within the same CAM row are largely inconsequential. In a match condition within a CAM row, however, a combined parasitic current equal to the average individual parasitic current multiplied by the number of CAM cells per row (i.e., the width of the row) is drawn from the match line, producing in the aforementioned drop in match line voltage. As the match line is used to signal a match or mismatch within the corresponding row of CAM cells, the transient drop in match line voltage may result in a false mismatch detection (i.e., CAM device should have detected and signaled a match, but does not) and ultimately, non-delivery of a packet or other system-level failure. Historically, such match line glitches have been addressed either by providing additional match line settling time (undesirably reducing compare throughput of the CAM device), or by applying additional match line precharge current to counteract the transient voltage drop, the latter solution further increasing the power consumption within the CAM device.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 is a logic table illustrating the possible combinations of a four-bit data/mask entity, a corresponding two-bit data representation, corresponding state representations, the constituent state bits of the ternary data map, and the match results for each of the four possible states of two-bit comparand entity;

FIG. 7 illustrates the reduced logic table that results when the redundant rows of table 6 are eliminated;

FIG. 12 is a logic table illustrating an exemplary write mapping of a four-bit data/mask entity, and comparand mapping of the four possible states of a two-bit comparand entity for the different states of the mode select signal;

FIG. 15 is a logic table illustrating the mode-selectable operation of a read mapping circuit according to one embodiment;

FIG. 22 is a logic table illustrating selective operation of the CAM device of FIG. 8 as either a state-mapped ternary CAM for comparing N-bit comparand values with contents of the CAM array, or as a bitwise arithmetic logic unit for performing programmable, bitwise Boolean operations on two multi-bit operands.

DETAILED DESCRIPTION

Figure 1:
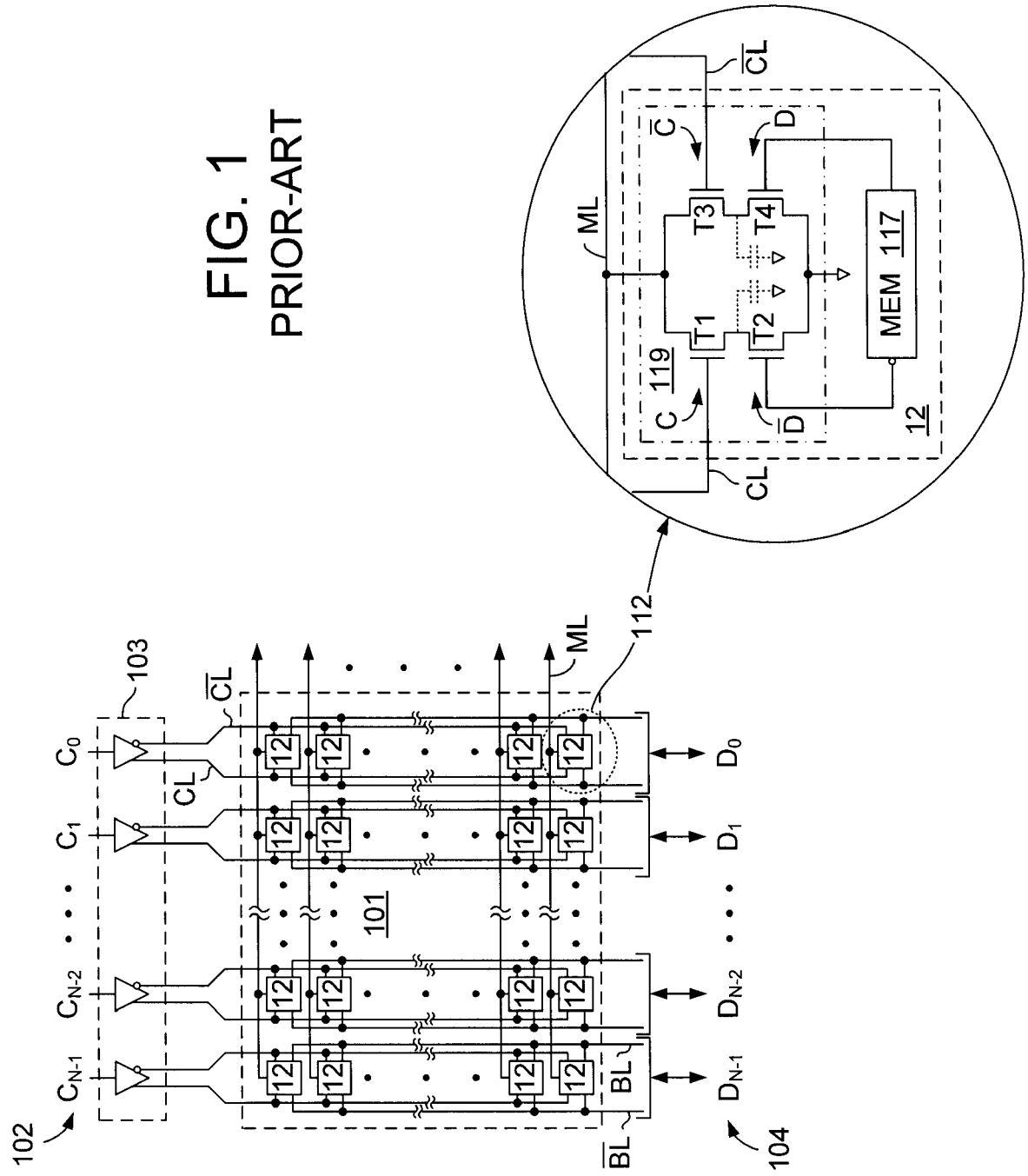
FIG. 1 illustrates a portion of a prior-art CAM device.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "terminal" is used to mean a point of electrical connection. The term "exemplary" is used to express but an example, and not a preference or requirement.

In embodiments of the present invention, the constituent bits of a comparand value are grouped into multi-bit comparand entities and decoded into corresponding values referred to herein as state maps. A state map is a multi-bit value in which each bit position corresponds to a respective bit pattern in the source comparand entity and has either a set bit or clear bit according to whether the constituent bits of the source comparand entity matches the bit pattern. Thus, an M-bit comparand value is decoded into an N-bit state map, where $N=2^M$, and in which only one bit of the state map is set (i.e., the "hot" bit) and the remaining N−1 bits are reset (i.e., the "clear" bits). During a compare operation, the constituent bits of a set of state maps are driven onto respective compare lines of a CAM array instead of complementary comparand bits as in the prior-art CAM device of FIG. 1. Consequently, only one of every N compare lines is energized per compare operation rather than one of every two, substantially reducing the power consumed in compare line transitions in embodiments in which N is greater than two. For example, in one embodiment N=4, so that only one-fourth of the compare lines are transitioned in each compare operation rather than one-half, thus halving the power consumed in compare line transitions relative to the prior-art CAM device of FIG. 1. Also, because fewer compare lines are energized per compare operation, fewer compare circuit transistors are switched on, reducing the parasitic current described in reference to FIG. 1. Consequently, the transient match line voltage drop due to parasitic discharge current is reduced, enabling more rapid restoration of the match line voltage level and/or use of a lower power pre-charge circuit, again reducing power consumption within the CAM device. Reduced compare line switching also reduces the ratio of switching current to device capacitance, thereby reducing supply voltage ripple within the CAM device and providing headroom for further reduction in device capacitance.

During a write operation, constituent bits of an incoming write data value are grouped into multi-bit data entities that are decoded or mapped into corresponding N-bit state maps and stored in an address-selected row of CAM cells within the CAM array. Each of the CAM cells includes a set of N storage elements to store the N-bits of a data state map (i.e., "data map," for short), and a compare circuit coupled to receive the data map from the storage elements and a comparand map (i.e., comparand state map) from the compare lines. In a binary CAM embodiment, the data maps have the same, one-hot format (i.e., single hot bit) as the comparand maps. Consequently, a matching data map and comparand map will have same-state bits in each bit position (i.e., hot and clear bits are aligned), while a mismatching data map and comparand map will have different-state bits in at least one position. Such conditions are detected by the compare circuit and used to discharge or isolate the match line accordingly. In a ternary CAM embodiment, constituent mask and data bits of a write data value are grouped into N-bit data/mask entities that are mapped to corresponding N-bit ternary data maps and stored within the CAM array. Each ternary data map has a number of hot bits according to the number of different states represented by the data and mask bits in the source entity and therefore may be compared with a comparand map in the same manner as in the binary CAM embodiment.

In other embodiments of the invention, comparand and data mapping circuitry may be selectively operated in either a state mapping mode or a ternary-conversion mode. Also, the comparand mapping circuitry and/or data mapping circuitry may be bypassed altogether, for example, for array testing purposes, for error checking purposes, and/or to enable a bitwise arithmetic logic mode of the CAM array. Read mapping circuitry may also be selectively operated in different data mapping modes or bypassed. In yet other embodiments, each CAM cell may include one or more additional compare circuits coupled to respective additional match lines.

Overview of a State-Mapping Binary CAM

Figure 2:
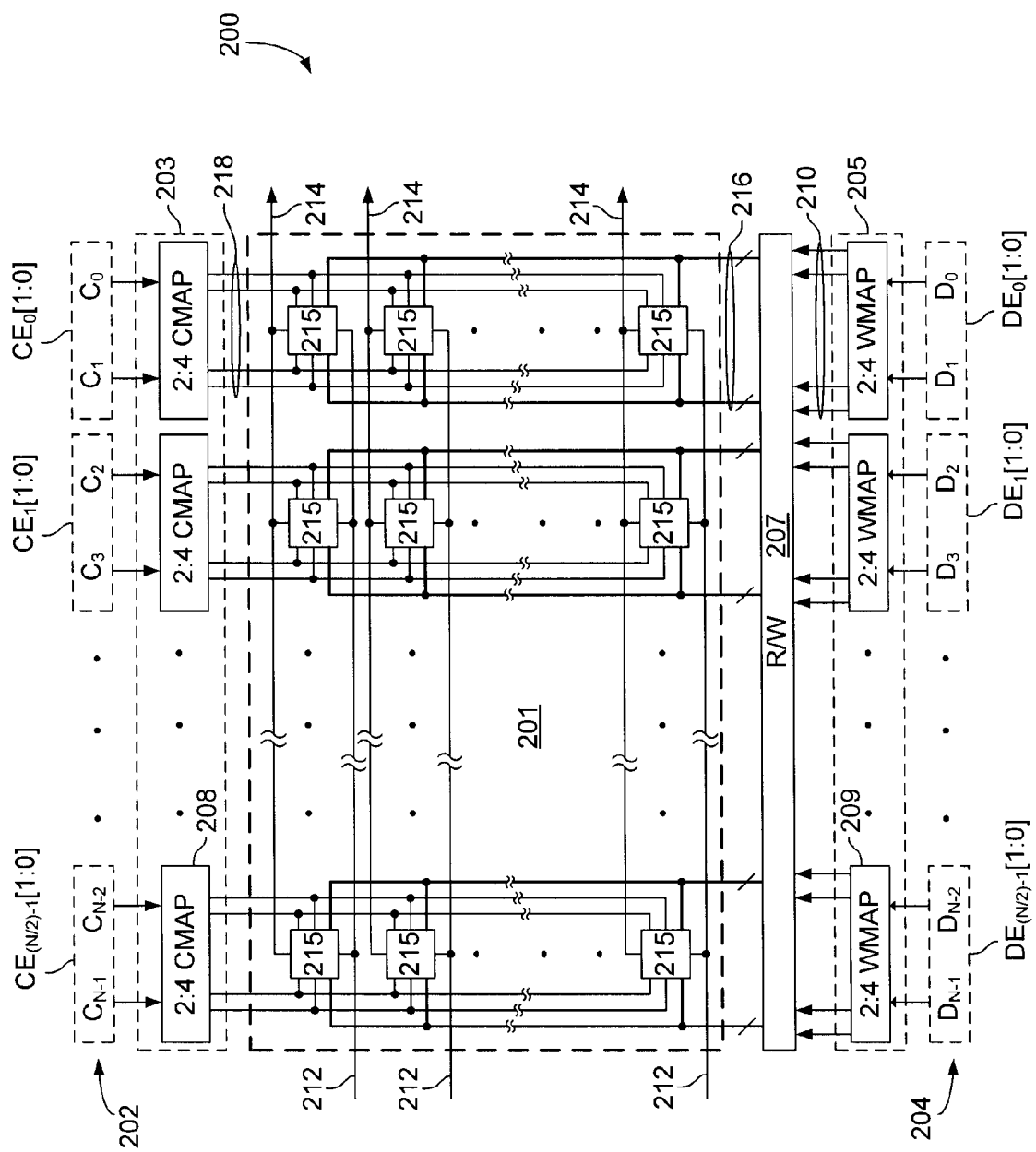
FIG. 2 illustrates a binary CAM device according to an embodiment of the invention.

FIG. 2 illustrates a binary CAM device 200 according to an embodiment of the invention. The CAM device 200 includes a CAM array 201, comparand mapping circuit 203, write mapping circuit 205 and read/write circuit 207. The CAM array 201 includes a plurality of CAM cells 215 arranged in rows and columns, with the columns of CAM cells 215 coupled to the read/write circuit 207 via respective sets of bit lines 216 and to the comparand mapping circuit via respective sets of compare lines 218. The rows of CAM cells 215 are coupled to respective match lines 214 and word lines 212. In a write operation, an incoming write data value 204 is provided to the write mapping circuit 205, which responsively generates a corresponding map word (i.e., formed by constituent data maps 210) and outputs the map word to the read/write circuit 207. The read/write circuit 207, in turn, outputs the constituent data maps of the map word onto respective sets of bit lines 216 for storage in a word-line-selected row of CAM cells 215 within the CAM array 201.

Although not shown in FIG. 2, optional registers may be provided to store incoming comparand and write data values. Also, though not shown, an address decoder is provided to activate the word lines 212 according to host-supplied or internally generated address values, and match logic and priority encoding logic is provided to generate match addresses and match flags (including multiple-match flags to signal multiple-match conditions) in response to the states of match lines 214 established in each compare operation. An instruction decoder or other control circuit (not shown) is provided to decode incoming instructions and issue corresponding control and timing signals to other circuit blocks within the CAM device, and one or more bus interfaces are provided to receive incoming instructions, write data words and comparand values, and to output match addresses, status values, read data words and so forth to a host device such as a host processor, network processor, application specific integrated circuit (ASIC) or other device.

In a compare operation within the CAM device 200, an incoming comparand value 202 is provided to the comparand mapping circuit 203 which, in response, generates a corresponding state-mapped comparand and outputs constituent comparand maps of the state-mapped comparand onto respective compare line sets 218 for comparison with the contents of the CAM array 201. In the embodiment of FIG. 2, each incoming comparand value includes N constituent bits, C[N−1:0], that are grouped into respective two-bit entities and provided to respective mapping sub-circuits 208 (CMAP) within the comparand mapping circuit 203. For example, bits $C_0$ and $C_1$ of the comparand value 202 are grouped to form two-bit comparand entity, $CE_0[1:0]$; bits $C_2$ and $C_3$ of the comparand value 202 are grouped to form comparand entity, $CE_1[1:0]$; and so forth to bits $C_{N-2}$ and $C_{N-1}$ of the comparand value 202, which are grouped to form comparand entity, $CE_{(N/2)-1}[1:0]$. If the comparand value 202 includes an odd number of bits, a dummy bit may be combined with the least or most significant bit of the comparand value 202 to form a two-bit comparand entity.

Figure 4:
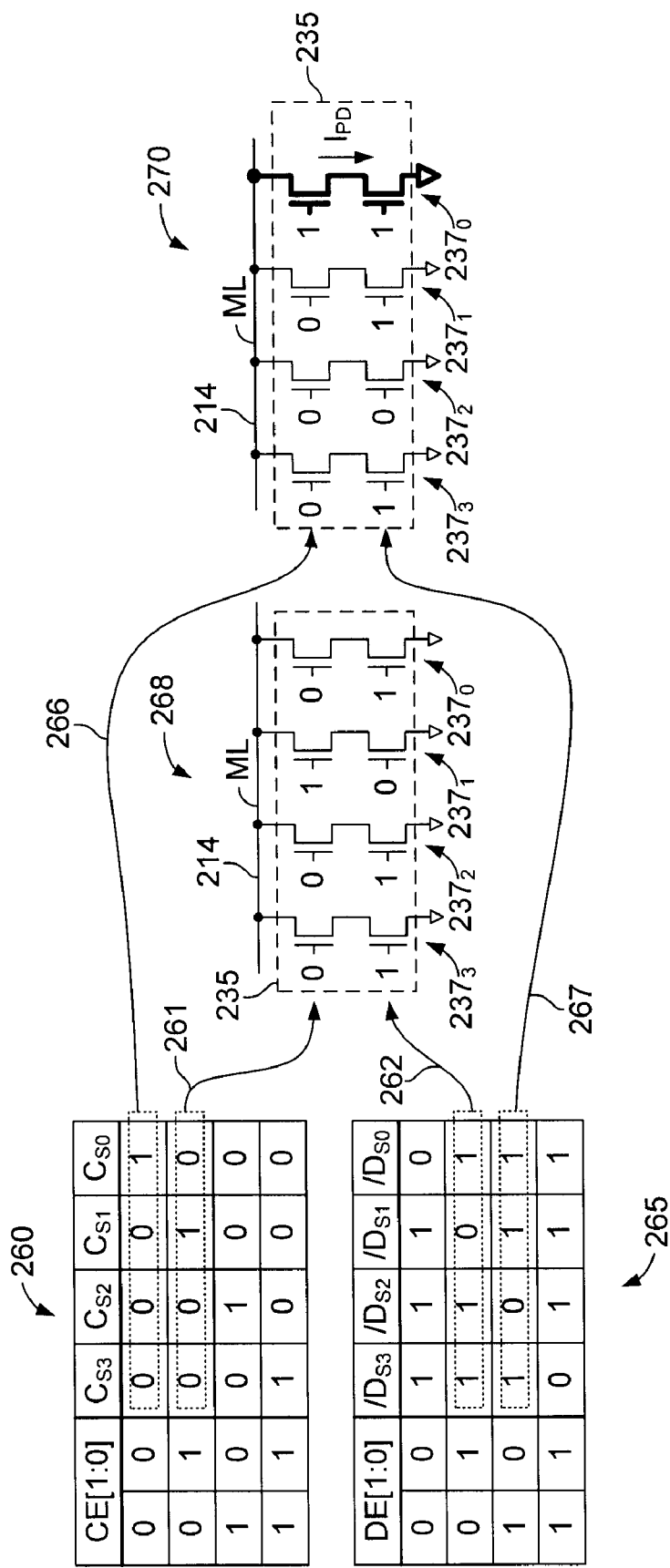
FIG. 4 illustrates a comparand mapping table and data mapping table and a pair of instances and of the compare circuit of FIG. 3, illustrating exemplary match and mismatch conditions.

In one embodiment, each of the decoder mapping sub-circuits 208 within the comparand mapping circuit 203 is a 2-bit-to-4-bit (2:4) decoder that generates a four-bit comparand map in accordance with table 260 shown in FIG. 4. That is, each different bit position within the comparand map corresponds to a respective one of the four possible states of the input comparand entity, CE[1:0]. The constituent bits of the comparand map (referred to herein as "state bits") are thus designated $C_{S0}$, $C_{S1}$, $C_{S2}$ and $C_{S3}$, with the subscript indicating the state of the comparand entity to which the bit corresponds. If the comparand entity has state zero (i.e., CE[1:0]= 00), state bit $C_{S0}$ is the hot bit (i.e., is set) and the remaining three state bits are cleared. If the comparand entity has state one (01), state bit CS1 is the hot bit and the remaining state bits are cleared. State bits CS2 and CS3 are similarly the hot bits for states two (10) and three (11) of the comparand entity, respectively.

Returning to FIG. 2, each of the comparand maps generated by the comparand mapping circuit are output to a respective column of CAM cells 215 via a respective set of four compare lines 218. By this operation, only one of every four compare lines is energized during each compare operation, thus halving the power required to drive the compare lines as compared to the one of every two compare lines energized in the prior-art embodiment of FIG. 1. The power consumed by traditional compare line drivers constitutes a substantial portion of the overall power budget, in some cases up to 30% or more of total device power, so that halving the compare line drive power significantly lowers the overall power consumption of the CAM device. In alternative embodiments, the number of bits, M, in the state mapped comparand entity may be increased to further reduce the number of compare lines energized per compare operation in proportion to the total number of compare lines.

In the embodiment of FIG. 2, each write data value 204 includes N constituent bits, D[N−1:0], that are grouped into respective two-bit data entities and provided to the write mapping circuit 205. For example, bits $D_0$ and $D_1$ of the write data value 204 are grouped to form data entity, $DE_0[1:0]$; bits $D_2$ and $D_3$ of the write data value are grouped to form data entity, $DE_1[1:0]$; and so forth to bits $D_{N-2}$ and $D_{N-1}$ of the write data value, which are grouped to form data entity, $DE_{(N/2)-1}[1:0]$. As with the comparand value, if the write data value 204 includes an odd number of bits, a dummy bit may be combined with the least or most significant bit of the write data value 204 to form a two-bit data entity. Each of the two-bit data entities, DE[1:0] is provided to a respective mapping sub-circuit 209 within the write mapping circuit 205 with the mapping sub-circuits, in turn, outputting respective data maps 210 to the read/write circuit 207. In one embodiment, each of the mapping sub-circuits 209 is a 2:4 decoder that generates a four-bit data map in accordance with table 265 of FIG. 4. That is, the data maps are generated in the same manner as the comparand maps, with each different bit position in the data map corresponding to a respective one of the four possible states of the input data entity, DE[1:0]. The constituent bits of the data map (i.e., the "state bits") are thus designated $D_{S0}$, $D_{S1}$, $D_{S2}$ and $D_{S3}$, with the subscript indicating the state of the data entity to which the bit corresponds. For example, if the data entity has state zero (i.e., DE[1:0]= 00), state bit $D_{S0}$ is the hot bit and the remaining three state bits are cleared. State bits DS1, DS2, and DS3 are similarly the hot bits for data entity states one (01), two (10) and three (11), with the other state bits being cleared in each instance.

Multi-Bit CAM Cell

Herein, the expression "CAM cell" refers to a store-and-compare circuit within a CAM array capable of storing the smallest individually maskable data entity. In the prior CAM array 101 of FIG. 1, for example, individual data bits stored within the CAM array may be masked by driving both compare lines of a given compare line pair low. Such CAM cells are referred to herein as single-bit CAM cells. By contrast, in the CAM cells of FIG. 2, the smallest individually maskable data entity is a two-bit entity, by virtue of the state mapping operations discussed above. Accordingly, CAM cells 215 are referred to herein as multi-bit CAM cells.

Figure 3:
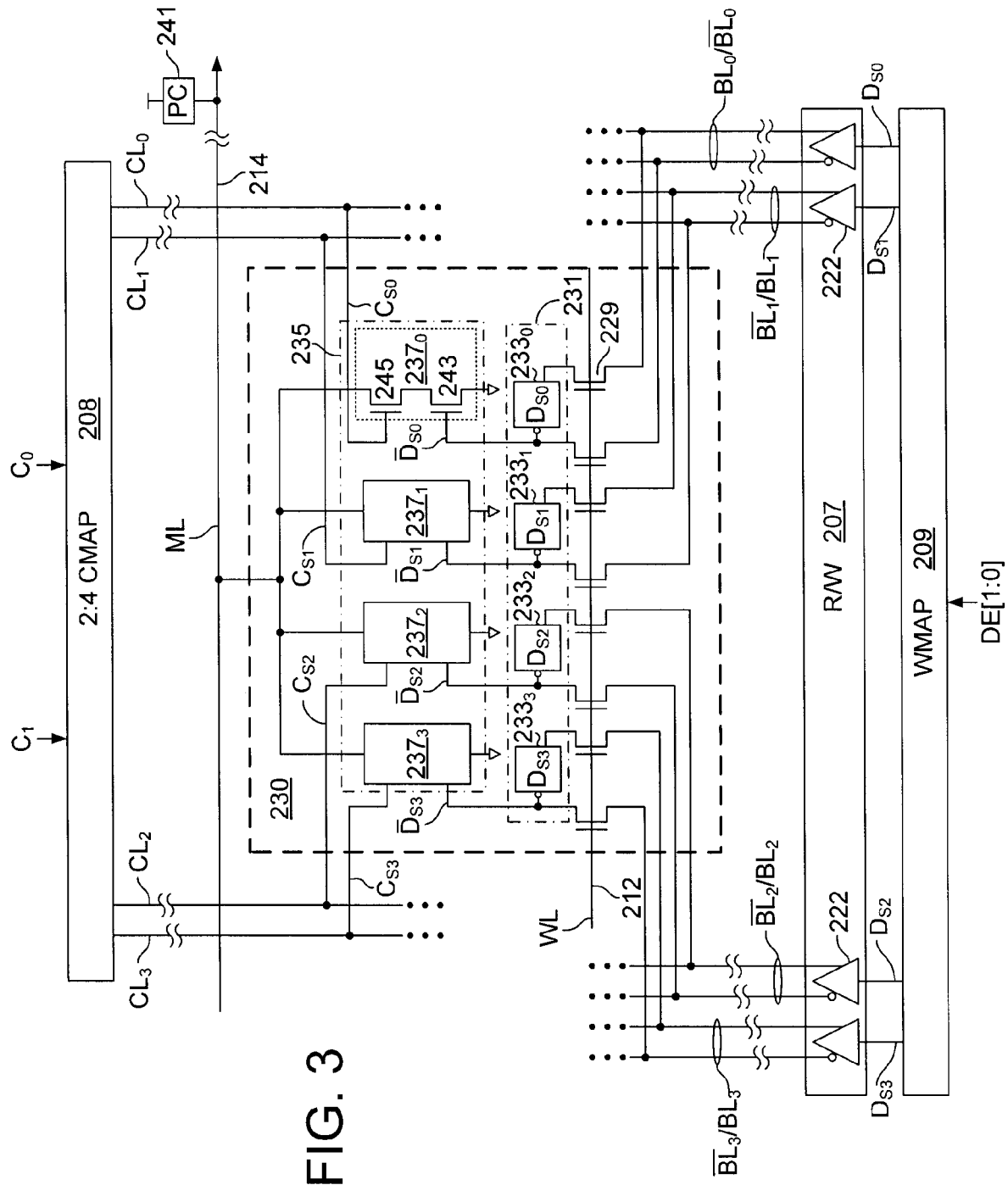
FIG. 3 illustrates a multi-bit CAM cell according to an embodiment of the invention.

FIG. 3 illustrates an embodiment of a multi-bit CAM cell 230 that may be used to implement the multi-bit CAM cells 215 of FIG. 2. CAM cell 230 includes a multi-bit storage circuit 231 and multi-bit compare circuit 235 to enable storage and comparison of the state-mapped, two-bit entities described in reference to FIG. 2. More specifically, the multi-bit storage circuit 231 includes four storage elements $233_0$-$233_3$ to store state bits $D_{S0}$-$D_{S3}$, respectively, of a two-bit data entity DE[1:0]. During a write operation directed to CAM cell 230 (i.e., directed to the row of multi-bit CAM cells to which CAM cell 230 belongs), a mapping sub-circuit 209 converts the two-bit data entity DE[1:0] into a data map having constituent state bits, $D_{S0}$-$D_{S3}$, as described above. The state bits are provided to respective differential bit line drivers 222 within the read/write circuit 207. The bit line drivers 222, in turn, output the state bits in complementary form onto respective pairs of bit lines, /$BL_0$,$BL_0$-/$BL_3$,$BL_3$. When a word line 212 coupled to the multi-bit CAM cell 230 is activated (i.e., in response to an address value that corresponds to the row of CAM cells which includes CAM cell 230), access-enable transistors 229 are switched to a conducting state to enable the complementary signals present on bit line pairs, /$BL_0$,$BL_0$-/ $BL_3$,$BL_3$, to be applied to the storage elements $233_0$-$233_3$, respectively. In an alternative embodiment, one or more of the bit line pairs, /$BL_0$,$BL_0$-/$BL_3$,$BL_3$, may be omitted, and the complementary signals otherwise transmitted on the omitted bit line pair may instead be time multiplexed onto another of the bit line pairs. For example, in one embodiment, bit line pairs /$BL_1$,$BL_1$ and /$BL_3$,$BL_3$ are omitted, and the corresponding data map signals transmitted on bit lines /$BL_0$,$BL_0$ and /$BL_2$,$BL_2$ (e.g., in a transmission that follows or precedes transmission of the data map signals transmitted on bit line pairs /$BL_0$,$BL_0$ and /$BL_2$,$BL_2$ in the fully parallel case shown in FIG. 3). In such an embodiment, bit line pairs /$BL_0$,$BL_0$ and /$BL_2$,$BL_2$ are coupled to storage elements $233_0$ and $233_2$ via a first set of access enable transistors 229 that are controlled by a first word line, and to storage elements $233_1$ and $233_3$ via a second set of access enable transistors 229 that are controlled by a second word line. In yet another embodiment, all but one of the bit line pairs /$BL_0$,$BL_0$-/$BL_3$,$BL_3$ may be omitted, and the four data state bits transferred over a single bit line pair in successive transfer operations. In such an embodiment, four word lines may be used to control respective pairs of access enable transistors so that one of the four storage elements 2330-2333 is accessed per transfer.

In one embodiment, each of the storage elements $233_0$-$233_3$ is a static storage element formed, for example, by back-to-back coupled inverters (i.e., forming a bi-stable latch). In alternative embodiments, the storage elements 233 may be formed by any circuit or structure capable of storing bitwise data, including dynamic storage elements (e.g., formed by capacitive elements that are periodically refreshed to maintain the stored state), non-volatile storage elements (e.g., electrically programmable read only memory (EPROM), including flash EPROM or other electrically erasable EPROM), and various other types of storage elements such as thyristor-based storage elements and the like. In any case, at the completion of the write operation, the state bits $D_{S0}$-$D_{S3}$ are stored within the storage elements $233_0$-$233_3$, respectively.

Still referring to FIG. 3, the compare circuit 235 includes switching circuits $237_0$-$237_3$ coupled in parallel between a match line and ground with each of the switching circuits $237_0$-$237_3$ having a data input coupled to receive a data state bit from a respective one of the storage elements $233_0$-$233_3$, and a comparand input coupled to receive a comparand state bit from a respective one of compare lines $CL_0$-$CL_3$. In one embodiment, each switching circuit 237 includes a series-coupled pair of transistors 243 and 245 as shown in the detail view of switching circuit $237_0$. The gate terminals of transistors 243 and 245 form the data and comparand inputs, respectively, of each switching circuit 237 so that, if both of the bits input to a given switching circuit 237 are hot (e.g., logic '1'), the switching circuit 237 is switched to a conducting state to discharge the match line 214 and thereby signal a mismatch condition. Conversely, if either of the input bits is clear, (e.g., either input bit is a logic '0'), the switching circuit remains in a non-conducting state. If none of the switching circuits $237_0$-$237_3$ are switched to a conducting state, the match line 214 is isolated from ground within the CAM cell 230, thereby indicating a match condition in the column position to which CAM cell 230 belongs. If all the CAM cells within a given row indicate a match condition, the match line 214 remains in the precharged (e.g., logic high) state established by precharge circuit 241 to signal a match condition.

In the embodiment of FIG. 3, the state bits $D_{S0}$-$D_{S3}$ are inverted by inverting outputs of the storage elements $233_0$-$233_3$ so that the compare circuit receives, in effect, a complemented data map having one clear bit and all other bits hot. As discussed below, when a comparand map matches a stored data map, the complementing of the data map causes the one clear bit of the data map to be applied to the same switching circuit as the one hot bit of the comparand map. As the remaining switching circuits all receive clear comparand state bits, none of the switching circuits is switched to the conducting state, thereby isolating the match line 214 within the CAM cell 230. When a comparand map and data map do not match, the hot bit of the comparand map is supplied to a switching circuit that also receives a hot bit of the complemented data map, thereby forming a path to ground to discharge the match line 214 and signal the mismatch condition. In an alternative embodiment, the state bits $D_{S0}$-$D_{S3}$ may be inverted by the write mapping circuit, or by the placement of the inverting output of the differential drivers 222 within the read/write circuit 207 (i.e., such that the inverting output drives the opposite bit line within each bit line pair as compared with the arrangement shown in FIG. 3). In either embodiment (inverting output of storage elements 233 or storage of complemented state bits $D_{S0}$-$D_{S3}$), the compare circuit 235 receives a one-hot comparand map and a one-clear data map.

FIG. 4 illustrates the comparand mapping table 260 and data mapping table 265 referenced above and a pair of instances 268 and 270 of the compare circuit 235 of FIG. 3, illustrating exemplary match and mismatch conditions, respectively. Referring first to the compare circuit instance 268, a two-bit comparand entity, CE[1:0], having state '01' is decoded into state bits $C_{S3}$-$C_{S0}$='0010' which, in turn, are applied to the comparand inputs of the switching circuits $237_3$-$237_0$, respectively, of the compare circuit 235 (i.e., as shown by arrow 261). A data entity, DE[1:0], also having state '01' is mapped to state bits DS3-S0='0010', with the complement state bits $/D_{S3}$-$/D_{S0}$='1101' being applied to the data inputs of the switching circuits $237_3$-$237_0$, respectively, as shown by arrow 262. Because the data and comparand entities match, the hot bit of the comparand map is aligned with the clear bit of the complemented data map (i.e., the hot com-parand bit and clear data bit are applied to the same switching circuit $237_1$), and the clear bits of the comparand map are aligned with the hot bits of the complement data map. Thus, in compare circuit instance 268, each of the switching circuits $237_0$-$237_3$ receives one clear bit and one hot bit, with the clear bit preventing the switching circuit from being switched to the conducting state. The arrangement shown at 268 in which each hot bit of the complemented data map is paired with a clear bit of the compare map and vice-versa is referred to herein as a matching alignment. It can be seen that a matching alignment is achieved in each four matching pairs of comparand and data entity states (00, 01, 10, 11) as the hot bit of the comparand map will be applied to the same switching circuit 237 as the clear bit of the complement data map.

Referring to the second compare circuit instance 270 shown in FIG. 4, a comparand entity having state '00' is decoded into state bits $C_{S3}$-$C_{S0}$='0001' and applied to the comparand inputs of the switching circuits $237_3$-$237_0$, respectively (i.e., as shown by arrow 266). A data entity having state '10' is mapped to state bits $D_{S3}$-$D_{S0}$='0100', with the complement state bits $/D_{S3}$-$/D_{S0}$='1011' being applied to the second inputs of the switching circuits $237_3$-$237_0$, respectively, as shown by arrow 267. Because the data and comparand entities do not match, the comparand map and data map have hot bits in different position and, therefore, the clear bit in the complemented data map is not aligned with the hot bit of the comparand map. That is, the single clear bit of the complement data map and the single hot bit of the comparand map are applied to different switching circuits $237_3$-$237_0$ within the compare circuit 235. Consequently, as shown by the bolded switching circuit $237_0$, the hot bit of the comparand map is aligned with a hot bit of the complement data map, thereby switching the switching circuit $237_0$ to a conductive state to discharge the match line and signal the mismatch condition. This condition is referred to herein as a mismatched alignment, and occurs for each of the twelve possible combinations of mismatching states of the two-bit comparand and data entities.

Reflecting on the CAM cell 230 of FIG. 3 and the exemplary compare circuit instances 268 and 270 shown in FIG. 4, it can be seen that only one of four of the transistors controlled by the comparand map (i.e., transistors 245) is switched on to perform, in effect, a two-bit compare operation. By contrast, in the prior-art CAM device described in reference to FIG. 1, one of two comparand-controlled transistors (T1 or T3) is switched on to form a single-bit compare operation. Thus, half as many transistors are switched on in the embodiment of FIG. 3 as in the embodiment of FIG. 1 for the same size comparand, thereby halving the parasitic current drawn from the match line to charge the drain node of data controlled transistors within the compare circuit 235 (i.e., transistors 243). The transient voltage drop on match line 214 is correspondingly reduced relative the match line voltage drop exhibited in the CAM device of FIG. 1, thereby enabling the match line voltage to be restored more quickly with a given size static or dynamic precharge circuit (i.e., element 241 of FIG. 3), potentially enabling faster match detection. Alternatively, a lower power precharge circuit may be used to restore the match line voltage in substantially the same time as in the CAM device of FIG. 1.

State-Mapped Ternary CAM

Referring to the CAM device 200 of FIG. 2 and the CAM cell 230 of FIG. 3, it can be seen that the number of storage elements per row of CAM cells is doubled relative to the prior-art CAM device of FIG. 1. That is, 2N storage elements are used to store the state bits that correspond to an N-bit write data value. In a ternary CAM embodiment, the same 2N storage elements otherwise required to store an N-bit data word and N-bit mask word may instead be used to store a 2N-bit map word (i.e., set of data maps). At the same time, the power-saving benefits of reduced compare line toggling and parasitic match line current, and the increased chip capacitance headroom are still realized.

Figure 5:
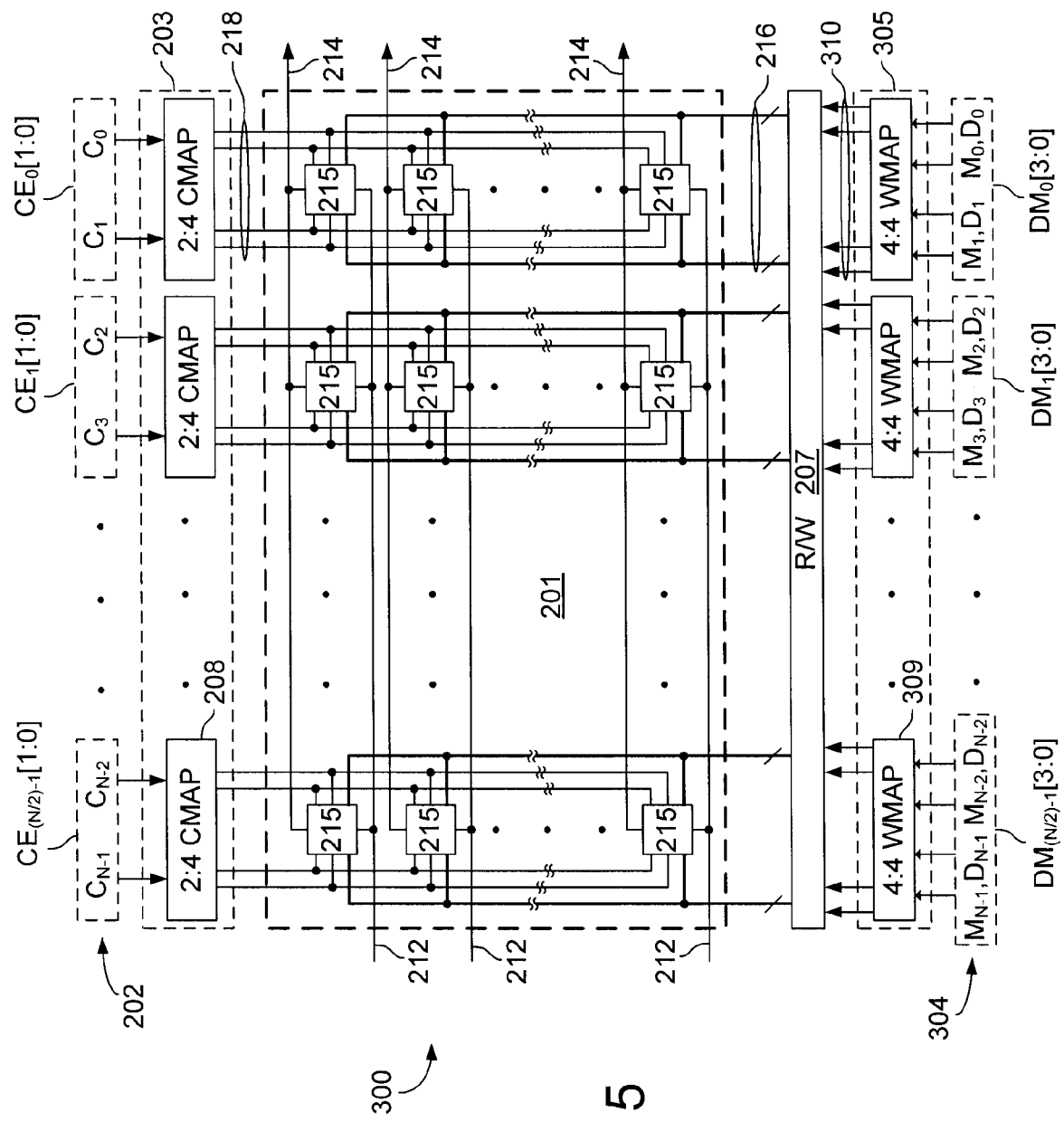
FIG. 5 illustrates a ternary CAM device according to an embodiment of the invention.

FIG. 5 illustrates a ternary CAM device 300 according to an embodiment of the invention. The ternary CAM device 300 includes a CAM array 201, comparand mapping circuit 203, write mapping circuit 305 and read/write circuit 207. As in the embodiment of FIG. 2, the CAM array 201 includes a plurality of multi-bit CAM cells 215 arranged in rows and columns, with the columns of CAM cells 215 coupled to the read/write circuit 207 via respective sets of bit lines 216 and to the comparand mapping circuit 203 via respective sets of compare lines 218. The rows of CAM cells 215 are coupled to respective match lines 214 and word lines 212. In a write operation, a 2N-bit write value 304, including an N-bit data word and N-bit mask word, is provided to the write mapping circuit 305. The write mapping circuit 305 converts (i.e., maps) the write value 304 into a 2N-bit map word having N/2 constituent data maps 310, and outputs the map word to the read/write circuit 207. The read/write circuit 207, in turn, outputs the constituent data maps 310 of the map word onto respective sets of bit lines 216 for storage in a word-line-selected row of the CAM cells 215. As in the embodiment of FIG. 2, optional registers (not shown) may be provided to store incoming comparand values and write values. Also, though not shown, an address decoder is provided to activate the word lines 212 according to externally supplied or internally generated address values, and match logic and priority encoding logic is provided to generate match addresses and match flags (including multiple match flags) in response to the match line states established in each compare operation. An instruction decoder or other control circuit (not shown) is provided to decode incoming instructions and issue corresponding control and timing signals to other circuit blocks within the CAM device 300, and one or more bus interfaces are provided to receive incoming instructions write data words and comparand values, and to output match addresses, status values, read data words and so forth to a host device such as a host process, network processor, application specific integrated circuit (ASIC) or other device.

Still referring to FIG. 5, the comparand mapping circuit 203 includes N/2 mapping sub-circuits 208 that operate in the manner described in reference to FIG. 2 to generate respective comparand maps (i.e., the comparand maps corresponding to respective two-bit comparand entities $CE_0[1:0]$-$CE_{(N/2)-1}[1:0]$) and to output the comparand maps onto respective sets of compare lines 218 for comparison with contents of the CAM array 201. The write mapping circuit 305 includes N/2 mapping sub-circuits 309 coupled to receive respective 4-bit data/mask entities $DM_0[3:0]$-$DM_{(N/2)-1}[3:0]$. Each data/mask entity includes a pair of data bits and a corresponding pair of mask bits, with each of the mask bits having a non-masking state (e.g., logic '0') to enable the corresponding data bit to participate in a compare operation, and a masking state (e.g., logic '1') to prevent the corresponding data bit from participating in a compare operation (i.e., mask the corresponding data bit). For example, data/mask entity $DM_0[3:0]$ includes data bits, $D_0$ and $D_1$, and corresponding mask bits, $M_0$ and $M_1$. If mask bit, $M_1$, is in the non-masking state and mask bit, $M_0$, is in the masking state, then data bit $D_0$ is masked, effectively representing a two-bit data entity $D_1:X$, where 'X' indicates a don't care state at the $D_0$ bit position. Thus, if $D_1=1$, then comparand entities '10' and '11' will both match the data/mask entity. If $D_1=0$, then comparand entities '00' and '01' will both match the data/mask entity. Similarly, if $M_0$ is in the non-masking state and $M_1$ is in the masking state, then the data/mask entity corresponds to $X:D_0$, and if $M_0$ and $M_1$ are both in the masking state, then the data/mask entity corresponds to X:X, and therefore will match any two-bit comparand entity.

Figures 6, 7:
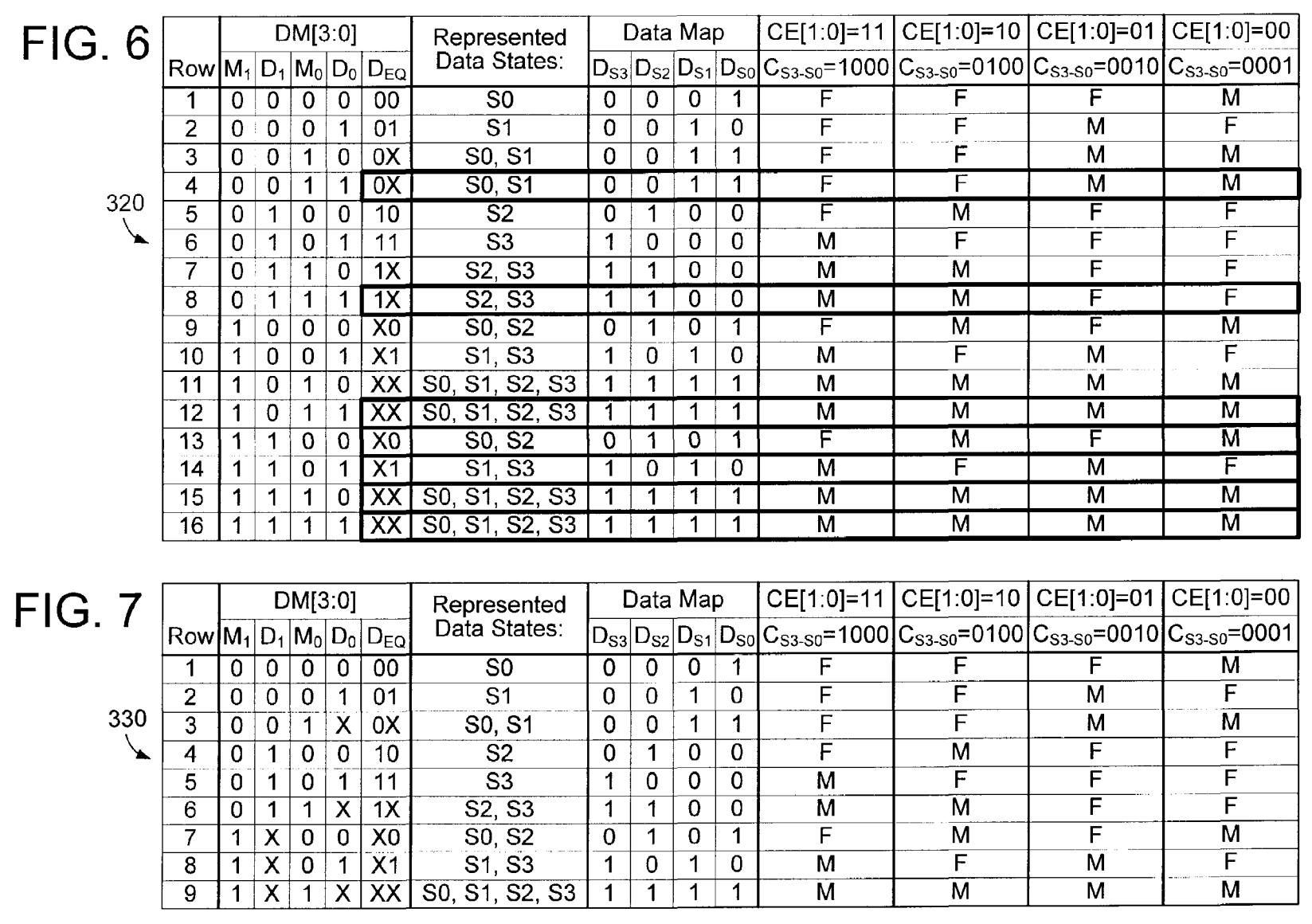

FIG. 6 is a logic table 320 illustrating the possible combinations of a four-bit data/mask entity, DM[3:0] (i.e., $D_0$, $M_0$, $D_1$ and $M_1$); the corresponding two-bit data representation, $D_{EQ}$, and represented states (i.e., S0, S1, S2 and/or S3 which correspond to two-bit states '00', '01', '10' and '11', respectively); the constituent state bits of the ternary data map generated by the mapping sub-circuits 309 of FIG. 5; and the match results for each of the four possible states of two-bit comparand entity, CE[1:0]. Referring to row 1 of the table 320, for example, when DM[3:0]='0000' (i.e., M1:D1:M0:D0='0000'), no masking is indicated so that the corresponding two-bit representation, DEQ, is '00'. Thus, the data/mask entity corresponds to data state S0 so that the mapping sub-circuit 309 generates a data map in which state bit, $D_{S0}$, is hot and state bits, $D_{S3}$, $D_{S2}$ and $D_{S1}$, are clear. A match alignment occurs when the comparand entity, CE[1:0]='00', as indicated by the 'M' in the corresponding column of table 320 (i.e., the rightmost column, captioned "CE[1:0]=00"); and mismatch alignments occur when the comparand entity is '01, 10 or '11', indicated by the 'F' in the corresponding columns of table 320. As discussed in reference to FIG. 4, the data map may be complemented before being stored within the CAM array, or may be output from inverting outputs of the storage elements within a CAM cell to achieve the desired match alignment or mismatch alignment.

Still referring to table 320, it can be seen that in rows 1, 2, 5 and 6, the non-masking states of mask bits $M_0$ and $M_1$ in the data/mask entity yield equivalent two-bit data values, $D_{EQ}$, that correspond to the four two-bit binary patterns described in reference to FIG. 4. That is, in each of rows 1, 2, 5 and 6, the data/mask entity represents exactly one of the four possible two-bit data states, and is matched by the corresponding state of the two-bit comparand entity, CE[1:0], in the manner described in reference to FIG. 4. By contrast, in row 3 of table 320, mask bit $M_0$ is in the masking state (i.e., a logic '1' in this example), mask bit $M_1$ is in the non-masking state and data bit $D_1$ is a '0', so that the data/mask entity corresponds to two-bit value '0X' ('X' indicating a don't care condition) which in turn represents equivalent two-bit states S0 ('00') and S1 ('01'). Accordingly, state bits $D_{S0}$ and $D_{S1}$ are hot and state bits $D_{S2}$ and $D_{S3}$ are clear in the ternary data map so that a comparand map corresponding to either of the two-bit states S0 or S1 will yield a match alignment and a comparand map corresponding to either of the two-bit states S2 or S3 will yield a mismatch alignment. That is, if the comparand map corresponds to either of the two-bit states S0 or S1, then the hot bit of the comparand map will be applied to the same switching circuit as a clear bit of the complement data map, thereby isolating the match line (i.e., in that specific CAM cell). If the comparand map corresponds to either of the two-bit states S2 or S3, then the hot bit of the comparand map will be applied to the same switching circuit (i.e., within the compare circuit of a CAM cell as shown in FIG. 3) as a hot bit of the complement data map, thereby forming a path to ground to discharge the match line. Thus, as shown in table 320, row 3, comparand maps '0001' and '0010', corresponding to comparand entities '00' and '01', will yield match indications when compared with data map '0011'; and comparand maps '0100' and '1000', corresponding to comparand entities '10' and '11' will yield mismatch indications.

Referring to table 320, row 7, mask bit $M_0$ is in the masking state, mask bit $M_1$ is in the non-masking state and data bit $D_1$ is a '1' so that the data/mask entity corresponds to two-bit value '1X' which in turn represents two-bit states S2 ('10') and S3 ('11'). Accordingly, state bits $D_{S2}$ and $D_{S3}$ are hot and state bits $D_{S0}$ and $D_{S1}$ clear in the ternary data map so that a comparand map corresponding to either of the two-bit states S2 or S3 will yield a match alignment and a comparand map corresponding to either of the two-bit states S0 or S1 will yield a mismatch alignment. In row 9 of the table 320, $M_1$ is in the masking state, $M_0$ is in the non-masking state and $D_0$ is a '0', so that the data/mask entity corresponds to two-bit value 'X0' which, in turn, represents two-bit states S0 ('00') and S2 ('10'). Accordingly, state bits $D_{S0}$ and $D_{S2}$ are hot and state bits $D_{S1}$ and $D_{S3}$ clear in the ternary data map so that a comparand map corresponding to either of states S0 or S2 will yield a match alignment and a comparand map corresponding to either of states S1 or S3 will yield a mismatch alignment. In row 10 of the table 320, $M_1$ is in the masking state, $M_0$ is in the non-masking state and $D_0$ is a '1', so that the data/mask entity corresponds to two-bit value 'X1' which, in turn, represents two-bit states S1 ('01') and S3 ('11'). Accordingly, state bits $D_{S1}$ and $D_{S3}$ are hot and state bits $D_{S0}$ and $D_{S2}$ clear in the ternary data map so that a comparand map corresponding to either of states S1 or S3 will yield a match alignment and a comparand map corresponding to either of states S0 or S2 will yield a mismatch alignment. In row 11 of the table, mask bits $M_1$ and $M_0$ are both in the masking state, so that the data/mask entity corresponds to two-bit value 'XX' which, in turn, represents all the possible two-bit states S0, S1, S2, and S3. Accordingly, all the state bits $D_{S0}$-$D_{S3}$ are hot in the ternary data map so that any of the four possible comparand maps will yield a match alignment. That is, the complement data map includes all clear bits and no hot bits so that none of the switching circuits (e.g., switching circuits 237 of FIG. 3) is switched to a conducting state, regardless of the state of the two-bit comparand entity.

Still referring to table 6, it can be seen that, due to the "don't care" effect of a set match bit in the data/mask entity DM[3:0], only nine distinct two-bit data entities are represented by the four-bit data/mask entity: '00', '01', '10', '11', '0X', '1X', 'X0', 'X1' and 'XX'. Consequently, for seven of the possible data/mask entity values (those in bolded rows 4, 8, and 12-16) the equivalent two-bit data value, and therefore the ternary data map, is the same as for one or more other data/mask entity values. For example, the ternary data map for row 4 of the table is the same as for row 3 (i.e., due to the masking of bit D0). Similarly, the ternary data maps for rows 8, 13, and 14 of the table are the same as for rows 7, 9 and 10, and the ternary data map for rows 12, 15 and 16 are the same as for row 11. FIG. 7 illustrates the reduced logic table 330 that results when the redundant rows of table 6 are eliminated.

Map Bypass and Mode Selectable Read and Write Data Mapping

Figure 8:
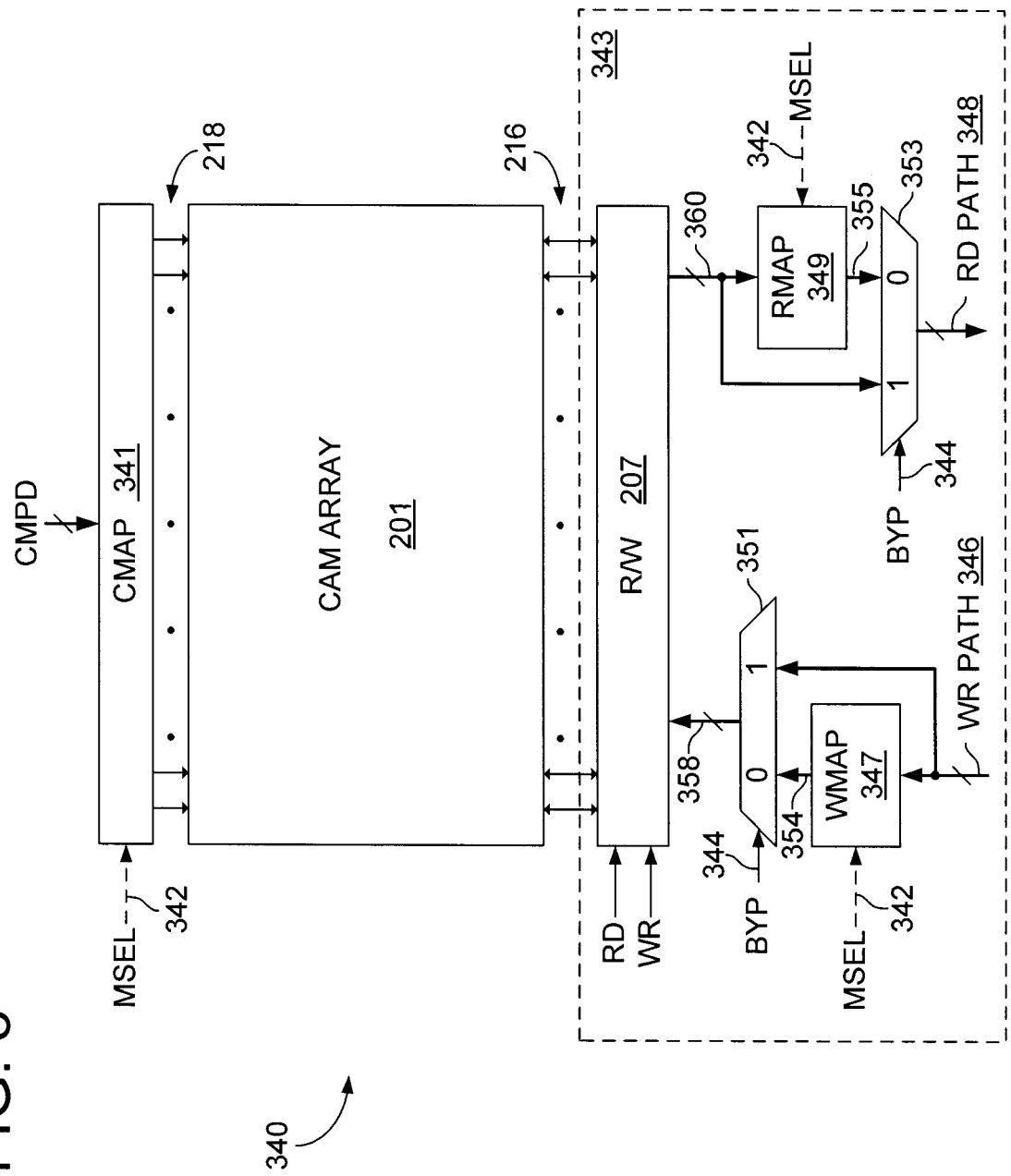
FIG. 8 illustrates a CAM device having selectively bypassable read and write mapping circuits according to an embodiment of the invention.

FIG. 8 illustrates a CAM device 340 having selectively bypass-able read and write mapping circuits according to an embodiment of the invention. The CAM device 340 includes a CAM array 201 having a plurality of multi-bit CAM cells, along with a comparand mapping circuit 207, and read/write logic 343. In one embodiment, the CAM array 201 and comparand mapping circuit 341 operate generally as described above in reference to FIGS. 2 and 5, comparing comparand maps generated by the comparand mapping circuit 341 to data maps stored within multi-bit CAM cells of the CAM array 201. In another embodiment, described in greater detail below, a mode select signal 342 is used to select between different comparand mapping modes, in effect, selecting between multi-bit and single-bit operating modes within the CAM device 340.

The read/write logic 343 includes a read/write circuit 207, ternary write mapping circuit 347, write data selector 351, read mapping circuit 349, and read data selector 353. The read/write circuit 207 is coupled to sets of bit lines 216 of the CAM array 201, as described in reference to FIGS. 2 and 5, and responds to read control signal (RD) and write control signal (WR) issued by an instruction decoder or other control circuit within the CAM device (not shown in FIG. 8) to carry out read and write accesses, respectively, to an address-selected row of CAM cells within the CAM array 201. The ternary write mapping circuit 347 has an input coupled to receive a write data value (which may be a mask/data value in a ternary CAM embodiment, or a data-only value in a binary CAM embodiment) from a write data path 346 and outputs a corresponding map word 354 to a first input port of the write data selector 351. A second input port of the write data selector 351 is coupled to the write data path 346 to receive the unmodified (i.e., non-mapped) write data value. A bypass signal 344 generated, for example, by an instruction decoder or received from a run-time or production-time programmable configuration circuit (not shown) is provided to a select input of the write data selector 351. When the bypass signal 344 is in a non-bypass state (e.g., logic '0'), the write data selector 351 selects the map word 354 from the ternary write mapping circuit 347 to be supplied, as a selected write word 358, to the read/write circuit 207, thereby enabling the map word 354 to be stored within the CAM array 201 as described in reference to FIGS. 2 and 5. By contrast, when the bypass signal 344 is in a bypass state (e.g., logic '1'), the ternary write mapping circuit 347 is bypassed, and the unmodified write data value is selected as the selected write word 358 and supplied to the read/write circuit for storage within the CAM array 201. The unmodified write data value may be selected for storage within the CAM array, for example and without limitation, for testing purposes (e.g., to isolate testing of storage elements within the CAM cells), and/or to store map values having states not otherwise generated by the write mapping circuit. As a more specific example, in an embodiment discussed below, the bypass signal 344 is set to the bypass state to enable storage of different bitwise Boolean operators represented by different patterns of data state bits, $D_{S0}$-$D_{S3}$, including patterns not used in the table 330 of FIG. 7.

In a ternary CAM embodiment, the widths of the write data path 346 and the output of the ternary write mapping circuit 347 may be the same (i.e., each 2N bits, where N is the number of bits in an input write data word and the number of bits in a corresponding mask word). In a binary CAM embodiment, the width of the write data path 346 may be narrower than output of the ternary write mapping circuit 347 (e.g., as in the embodiment of FIG. 2 where the write mapping circuit 205 effectively expands an N-bit write data word to a 2N-bit map word) in which case the bits of the write data value may each be supplied to two inputs of the second input port of the write data selector 351 (i.e., doubling the write data word at the write data selector input to match the width of the ternary write mapping circuit output) or half the 2N inputs to the read/write circuit 207 may be coupled to a reference voltage node (e.g., ground or supply) when the write data path 346 is selected as the write data source. Alternatively, two N-bit write data values may be supplied to the second input port of the write data selector 351, for example, by buffering a first N-bit write data value, and supplying the buffered write data value to N inputs of the second input port of the write data selector 351 and supplying an incoming, second N-bit write data value to the remaining N inputs of the second input port.

Figure 9:
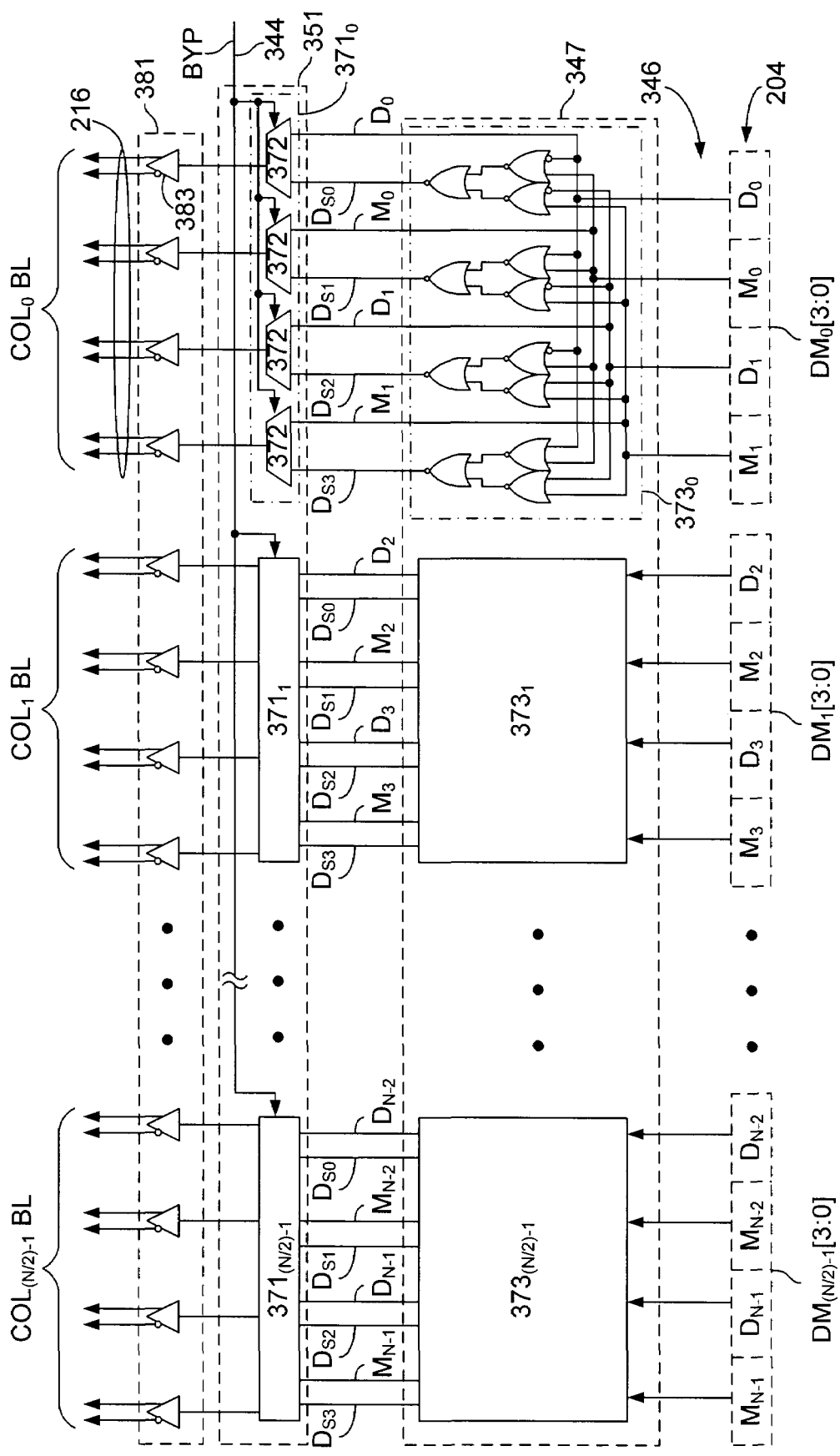
FIG. 9 illustrates an embodiment of a ternary write mapping circuit, together with a write data selector and a bit line driver.

FIG. 9 illustrates an embodiment of a ternary write mapping circuit 347, together with a write data selector 351 and a bit line driver 381 (i.e., the bit driver 381 being a component of a read/write circuit such as read/write circuit 207 of FIG. 8). The ternary write mapping circuit 347 includes a set of N/2 mapping sub-circuits $373_0$-$373_{(N/2)-1}$, each of which includes a set of logic gates (illustrated by example in the detail view of sub-circuit $373_0$) that implement the data mapping function illustrated in table 7. That is, for each of the nine possible two-bit data representations, '00', '01', '10', '11', '0X', '1X', 'X0', 'X1' and 'XX' indicated by individual data/mask bit pairs, DM[3:0], the corresponding mapping sub-circuit 373 outputs a corresponding set of state bits, $D_{S0}$-$D_{S3}$, to the write data selector 351 in the bit pattern shown in table 7.

The write data selector 351 includes a set of component selectors $371_0$-$371_{(N/2)-1}$ each coupled to receive the state bits $D_{S0}$-$D_{S3}$ from a respective one of the mapping sub-circuits $373_0$-$373_{(N/2)-1}$. In the particular embodiment of FIG. 9, each of the component selectors includes four multiplexers 372 each having a first input port coupled to receive a respective state bit from the corresponding mapping sub-circuit 373, and a second input port coupled to receive a respective mask or data bit of the input data entity, DM[3:0]. The select inputs of the multiplexers 372 are coupled in common to receive the bypass signal 344 so that, when the bypass signal 344 is in the non-bypass state, the data maps generated by the mapping sub-circuits $373_0$-$373_{(N/2)-1}$ are passed to the bit line driver 381. When the bypass signal is in the bypass state, the mapping sub-circuits $373_0$-$373_{(N/2)-1}$ are bypassed and the constituent bits of the input data entities $DM_0$[3:0]-$DM_{(N/2)-1}$[3:0] are supplied to the bit line driver 381. The bit line driver 381 includes component driver circuits 383 to output the selected write values, either the data maps or the unmapped data entities, onto respective sets of bit lines 216 for the N/2 columns of CAM cells.

Returning to FIG. 8, during a read operation, data state signals stored within an address-selected row of CAM cells within the CAM array 201 are enabled onto the sets of bit lines 216 (i.e., in response to activation of the corresponding word line). Sense amplifier banks within the read/write circuit 207 receive the data state signals and amplify the data state signals to logic levels, thus retrieving a map word 360 from the CAM array. The map word 360 is input to the read mapping circuit 349 which converts the 2N-bits of the map word 360 into a 2N-bit read value 355 having an N-bit data word and an N-bit mask word. Thus, the read mapping circuit 349 performs the inverse of the function performed by the write mapping circuit 247, converting from map word to a data/mask read value 355. The read value 355 generated by the read mapping circuit 349 and the map value 360 generated by the read/write circuit 207 are supplied to first and second input ports, respectively, of the read data selector 353. The bypass signal 344 is supplied to a select input of the read data selector 353 and used to select either the map word 360 (the bypass selection) or the read value 355 (the non-bypass selection) to be output onto a read data path 348 as a selected output value.

Figure 10:
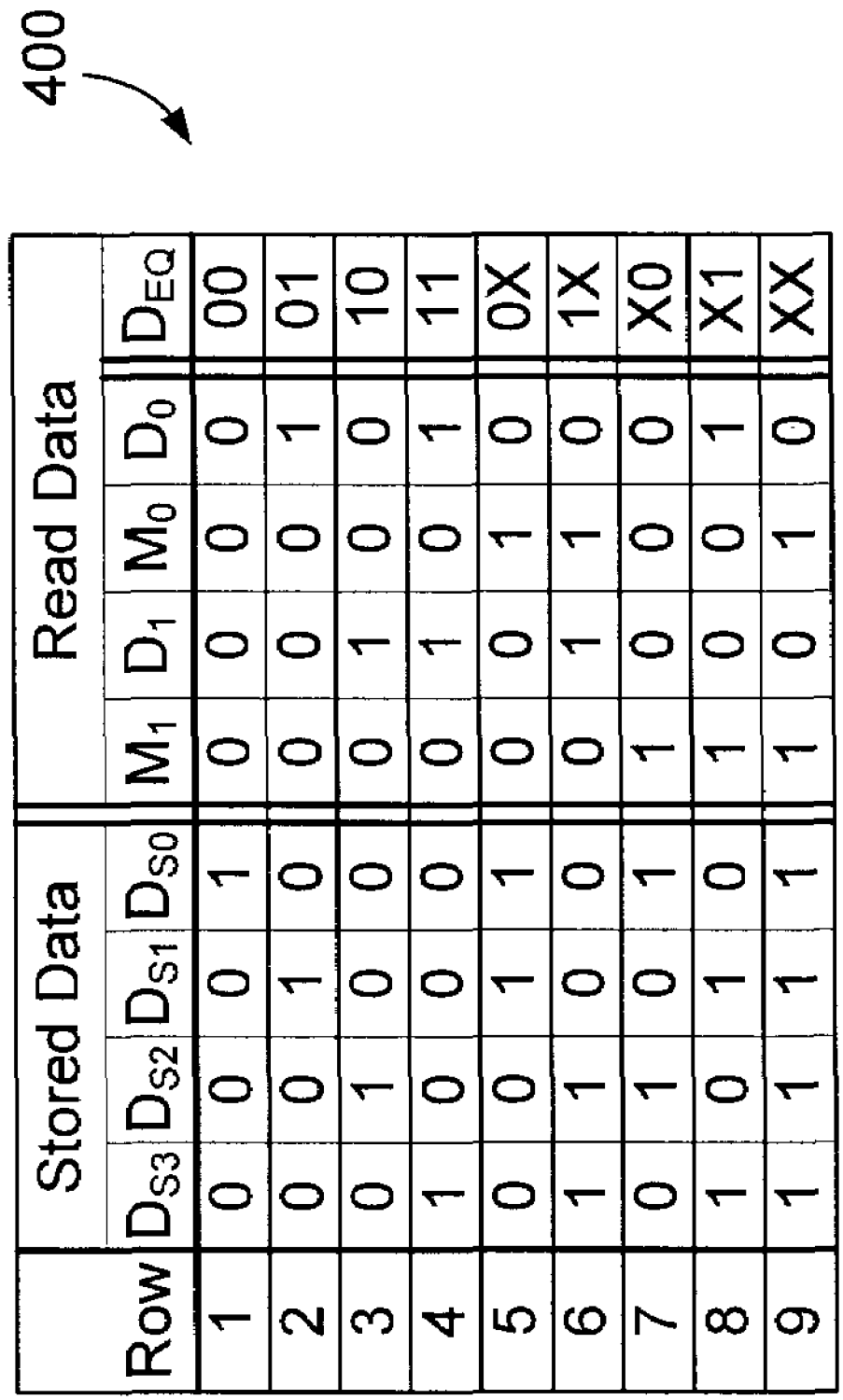
FIG. 10 is a logic table illustrating an exemplary data conversion performed by the read mapping circuit of FIG. 8.

FIG. 10 is a logic table 400 illustrating an exemplary data conversion performed by the read mapping circuit 349 of FIG. 8. More specifically, the read mapping circuit 349 converts (i.e., maps) the four state bits $D_{S0}$-$D_{S3}$ of a data map stored within a given CAM cell to a four-bit read data entity containing data bits, $D_0$, $M_0$, $D_1$ and $M_1$. In rows 1-4 of the table 400, the data map contains a single hot bit and therefore corresponds to an unmasked two-bit data entity '00', '01', '10' or '11' as indicated in the equivalent data column captioned, $D_{EQ}$. Thus, when the data map has the states shown in rows 1-4, the read mapping circuit generates a four-bit data/mask entity in which the mask bits, $M_1$ and $M_0$, are in the non-masking state (logic '0' in this example) and in which the data bits, $D_1$ and $D_0$, have the states shown in the equivalent data column. In each of rows 5-8 of the table, the data maps include two hot state bits, indicating that one of the data bits is masked (i.e., corresponding mask bit is in the masking state). For example, in row 5, state bits $D_{S0}$ and $D_{S1}$ are hot and state bits $D_{S2}$ and $D_{S3}$ are clear, thus indicating that $D_1$ is an unmasked logic '0' value (i.e., otherwise at least one of state bits $D_{S2}$ and $D_{S3}$ would be hot) and that $D_0$ is masked. Accordingly, the read mapping circuit 349 generates a data/mask entity in which mask bits $M_1$ and $M_0$ are '0' and '1', respectively, and in which data bits $D_1$ and $D_0$ are both '0'. Note that the original state of $D_0$ (i.e., in the write data word used to generate the '0011' data map) is unknown and may have been a '1' or a '00'. In the embodiment of FIG. 10, unknown states of masked data bits are resolved by setting the data bit to '0' in the read data entity. In an alternative embodiment, such masked data bits may be set to '1' or may be alternated between '1' and '00' values in successive read operations. In row 6 of the table, state bits $D_{S2}$ and $D_{S3}$ are hot and state bits $D_{S0}$ and $D_{S1}$ are clear, indicating that data bit $D_1$ is an unmasked logic '1' value (i.e., otherwise at least one of state bits $D_{S0}$ and $D_{S1}$ would be hot) and that $D_0$ is masked. Accordingly, the read mapping circuit 349 generates a data/mask entity in which mask bits $M_1$ and $M_0$ are '0' and '1', respectively, and in which data bit $D_1$ is a '1' and data bit $D_0$ is a '00'. In row 7 of the table, state bits $D_{S0}$ and $D_{S2}$ are hot and state bits $D_{S1}$ and $D_{S3}$ are clear, indicating that data bit $D_0$ is an unmasked logic '0' value (i.e., otherwise at least one of state bits $D_{S1}$ and $D_{S3}$ would be hot) and that $D_1$ is masked. Accordingly, the read mapping circuit 349 generates a data/mask entity in which mask bits $M_1$ and $M_0$ are '1' and '0', respectively, and in which data bits $D_1$ and $D_0$ are both '0'. In row 8 of the table, state bits $D_{S1}$ and $D_{S3}$ are hot and state bits $D_{S0}$ and $D_{S2}$ are clear, indicating that data bit $D_0$ is an unmasked logic '1' value (i.e., otherwise at least one of state bits $D_{S0}$ and $D_{S2}$ would be set) and that $D_1$ is masked. Accordingly, the read mapping circuit 349 generates a data/mask entity in which mask bits $M_1$ and $M_0$ are '1' and '0', respectively, and in which data bit $D_1$ is a '0' and data bit $D_0$ is a '1'. In row 8 of the table, all the state bits are hot, indicating that data bits $D_0$ and $D_1$ are both masked. Accordingly, the read mapping circuit 349 generates a data/mask entity in which mask bits $M_1$ and $M_0$ are both '1' and in which data bits $D_1$ and $D_0$ are both '0'.

Still referring to FIG. 10, in the event of a soft error or other failure, the data map stored within or output from a given CAM cell may be corrupted and exhibit a state other than one of the nine states shown in table 400. In one embodiment, the read mapping circuit 349 maps such invalid data maps to a predetermined data/mask pattern (e.g., all zeroes). Alternatively, the read mapping circuit 349 may respond to such invalid states in whatever manner yields the simplest or otherwise desirable combinatorial logic for generating the output data and mask bits. As discussed below, an error detection circuit and/or circuitry within the read mapping circuit may additionally assert an error signal to indicate that a corrupted data map has been read.

Figure 11:
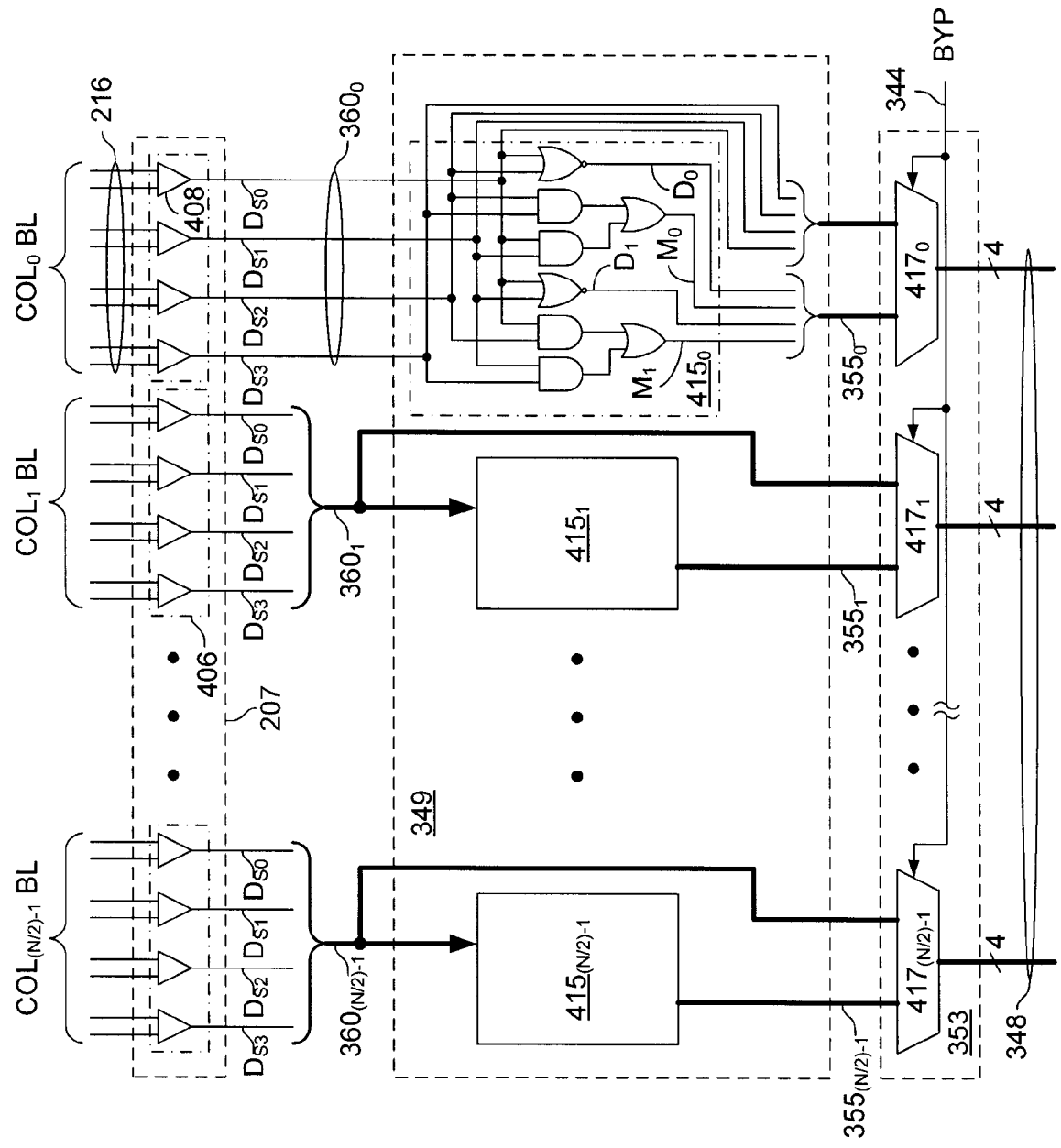
FIG. 11 illustrates an embodiment of the read mapping circuit of FIG. 8, a set of sense amplifier banks within a read/write circuit and a read data selector.

FIG. 11 illustrates an embodiment of the read mapping circuit 349 of FIG. 8, a set of sense amplifier banks 406 within a read/write circuit 207 and a read data selector 353. Each of the sense amplifier banks 406 includes four sense amplifier circuits 408 coupled to respective pairs of bit lines that constitute a set of bit lines 216 for a corresponding column of CAM cells. During a read operation, each sense amplifier circuit 408 within each sense amplifier bank 406 amplifies a differential voltage present on the corresponding bit line pair (i.e., generated by a respective storage element within an address-selected row of CAM cells) to generate a logic level signal. Thus, each sense amplifier bank 406 outputs a respective four-bit data map $360_0$-$360_{(N/2)-1}$ to the read mapping circuit 349, the complete set of data maps forming the map word 360 shown in FIG. 8. The read mapping circuit 349 includes mapping sub-circuits $415_0$-$415_{(N/2)-1}$ (only the first two of which are shown in FIG. 11) coupled to receive respective data maps from the sense amplifier banks 406. Each of the mapping sub-circuits $415_0$-$415_{(N/2)-1}$ includes a set of logic gates (as shown, for example, in the detail view of mapping sub-circuit $415_0$) to generate a respective four-bit read data entity $355_0$-$355_{(N/2)-1}$, in accordance with the table of FIG. 10. That is, each of the four-bit read data entities includes a pair of data bits and a corresponding pair of mask bits ($M_1$: $D_1$:$M_0$:$D_0$) and collectively form the read data value 355 illustrated in FIG. 8). Other combinations of logic gates may be used in alternative embodiments to achieve alternate conversions of state maps to read data entities. The mapping sub-circuits $415_0$-$415_{(N/2)-1}$ output the four-bit read data entities $355_0$-$355_{(N/2)-1}$ to first input ports of respective multiplexers, $417_0$-$417_{(N/2)-1}$, within the read data selector 353. The data maps $360_0$-$360_{(N/2)-1}$ are supplied to respective second input ports of the multiplexers, $417_0$-$417_{(N/2)-1}$. The multiplexers $417_0$-$417_{(N/2)-1}$ each have a select input coupled in common to receive the bypass signal 344. By this arrangement, when the bypass signal is in a non-bypass state, the read data entities $355_0$-$355_{(N/2)-1}$ generated by the mapping sub-circuits $415_0$-$415_{(N/2)-1}$, respectively, are output onto the read data path 348 as a selected output value. When the bypass signal is in a bypass state, the mapping sub-circuits, $415_0$-$415_{(N/2)-1}$, are bypassed, and the data maps, $360_0$-$360_{(N/2)-1}$, generated by the sense amplifier banks 406 are output onto the read data path 348 as the selected output value.

As mentioned in reference to FIG. 8, a mode select signal 342 may optionally be used to select between two or more mapping schemes within the read and write mapping circuits (349 and 347) and within the comparand mapping circuit 341. In one embodiment, for example, when the mode select signal 342 is in a first state, the write mapping circuit 347 converts four-bit data/mask entities into corresponding four-bit data maps and the comparand mapping circuit 341 converts two-bit comparand entities into four-bit comparand maps. When the mode select signal is in a second state, the write mapping circuit 347 converts individual data/mask bit pairs into ternary data values referred to herein as XY values, and the comparand mapping circuit 341 outputs individual comparand bits onto compare line pairs in complementary form.

FIG. 12 is a logic table 450 illustrating an exemplary write mapping of a four-bit data/mask entity, DM[3:0], and comparand mapping of the four possible states of a two-bit comparand entity, CE[1:0], for the different states of the mode select signal 342. When the mode select signal is in a first state (logic '0' in this example), a state mapped mode of operation is selected within a write mapping circuit and comparand mapping circuit (e.g., circuits 347 and 341 of FIG. 8). In the state mapped mode, the data/mask entity, DM[3:0], and comparand entity, CE[1:0], are converted to a data map and comparand map in the manner described above in reference to FIG. 7. That is, the four-bit comparand map has a single hot bit for each of the four possible states of the two-bit comparand entity, and the data map has one, two or four hot bits when zero, one or both of the mask bits are in a masking state, respectively.

When the mode select signal is in the second state (logic '1' in this example), an XY mode of operation is selected within the write mapping circuit and comparand mapping circuit. In the XY mode, the two data/mask bit pairs within each four-bit data/mask entity, DM[3:0] are treated individually and each mapped to a respective X- and Y-bits of a two-bit XY value. The constituent bits of a two-bit comparand entity CE[1:0] are similarly treated individually, with each bit being driven in complementary fashion onto a pair of compare lines for comparison with the two bits of a corresponding XY value. Referring to bit pair $M_0D_0$ of the data/mask entity DM[3:0], for example, if mask bit $M_0$ is in a non-masking state, then $X_0$ has the same state as $D_0$, and $Y_0$ the complement of $D_0$. If mask bit $M_0$ is in a masking state, then both $X_0$ and $Y_0$ are '0'. Bit pair $M_1D_1$ is similarly mapped to $X_1Y_1$. Expressed in Boolean form, X=D*/M; and Y=/D*/M, where '*' indicates a logic AND function.

Referring to FIG. 3, when the XY mode is selected, the multi-bit CAM cell 230 is effectively operated as two bitwise CAM cells rather than a single, multi-bit CAM cell. More specifically, storage elements $233_0$ and $233_1$ are used to store a first pair of XY bits ($X_0$ and $Y_0$) and compare circuits $237_0$ and $237_1$ are used to compare the XY bit pair with a first comparand bit $C_0$, while storage elements $233_2$ and $233_3$ are used to store a second pair of XY bits ($X_1$ and $Y_1$) and compare circuits $237_2$ and $237_3$ are used to compare the XY bit pair with a second comparand bit, $C_1$. Referring to the bitwise CAM cell formed by the interconnection of storage elements $233_0$ and $233_1$ and compare circuits $237_0$ and $237_1$, bits $X_0$ and $Y_0$ (which correspond to data/mask pair $D_0M_0$) are stored in complement in the storage elements designated $233_1$ and $233_0$ and supplied to switching circuits $237_1$ and $237_0$, respectively (note that complementing the $X_0Y_0$ bits counteracts the complement effected by the inverting outputs of the storage elements 233). Comparand bit $C_0$ (i.e., bit zero of CE[1:0]) is driven in complementary fashion onto compare lines $CL_0$ and $CL_1$ so that $C_0$ and /$C_0$ are supplied to switching circuits $237_0$ and $237_1$, respectively. Thus, whenever mask bit $M_0$ is in a non-masking state, switching circuit $237_0$ receives $C_0$ and /$D_0$ as inputs (i.e., because $Y_0$=/$D_0$), and switching circuit $237_1$ receives /$C_0$ and $D_0$ as inputs (i.e., because $X_0$=$D_0$). Accordingly, if $D_0$ and $C_0$ match, then at least one of the inputs to both switching circuits $237_0$ and $237_1$ will be low, thereby preventing the switching circuits from discharging the match line 214. If $D_0$ and $C_0$ do not match, then both inputs to one of the switching circuits $237_0$ and $237_1$ will be high, switching the switching circuit to a conducting state to discharge the match line 214 and signal the mismatch condition. When the mask bit $M_0$ is in the masking state, then both the switching circuits $237_0$ and $237_1$ are switched off by the low states of the $X_0$ and $Y_0$ bits, thereby indicating a match condition regardless of the state of the comparand bit $C_0$. In XY mode, the single-bit CAM cell formed by switching circuits $237_2$ and $237_3$ and storage elements $233_2$ and $233_3$ operates in the same manner as the single bit CAM cell formed by switching circuits $237_0$ and $237_1$, and storage elements $233_0$ and $233_1$, but stores bits $X_1$ and $Y_1$ and receives comparand bits $C_1$ and /$C_1$.

Returning to the table of FIG. 12, it can be seen that, when the mode select signal is '1', selecting the XY mode, each XY bit pair is generated in states according to the corresponding input mask/data bit pairs in the manner described above. That is, $X_i$=$D_i$*/$M_i$, $Y_i$=/$D_i$*/$M_i$, where i indicates the $i^{th}$ bit position within a data/mask value. Similarly, the four compare lines applied to each CAM cell may be viewed as two pairs of compare lines, with each compare line pair carrying one hot bit and one clear bit.

Figure 13:
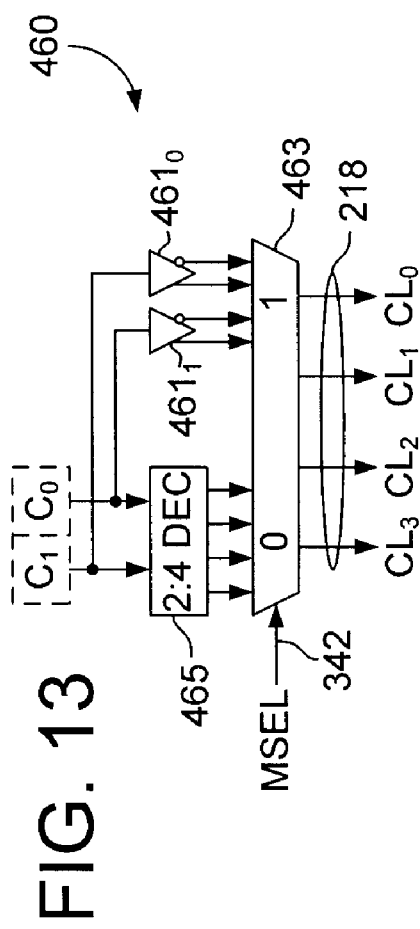
FIG. 13 illustrates an embodiment of a comparand mapping sub-circuit that may be used within the comparand mapping circuit of FIG. 8 to generate the comparand signals output onto the sets of compare lines.

FIG. 13 illustrates an embodiment of a comparand mapping sub-circuit 460 that may be used within the comparand mapping circuit 341 of FIG. 8 to generate the comparand signals output onto a set of four compare lines 218 (i.e., compare lines $CL_0$-$CL_3$). As shown, a pair of comparand bits, $C_0$ and $C_1$ are supplied to a 2:4 decoder 465 to generate a four-bit compare map, and are also supplied to respective output drivers $461_0$ and $461_1$. The compare map is supplied to a first input of a comparand selector 453 (e.g., a multiplexer), and the complementary comparand signals generated by the output drivers 461 are supplied to a second input of the comparand selector 453. The mode select signal 342 is supplied to a select input of the comparand selector so that, when a state mapping mode is selected (i.e., mode select signal is low), the compare map is output onto the compare lines 218 and, when the XY mode is selected, the two pairs of complementary comparand signals generated by output drivers $461_0$ and $461_1$ are output onto the compare lines 218.

Figure 14:
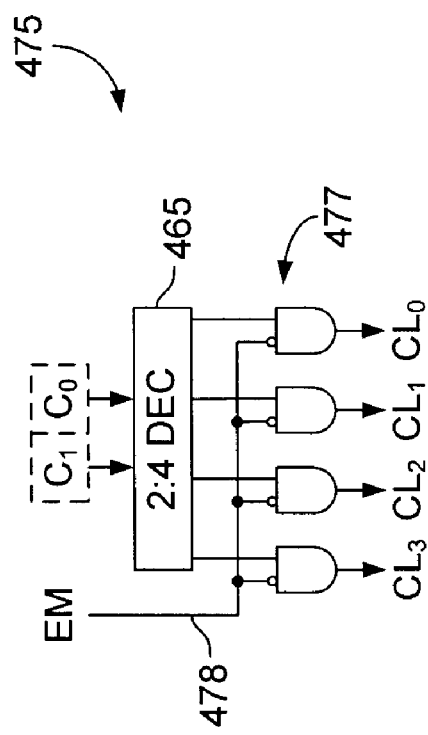
FIG. 14 illustrates a mapping sub-circuit that may be used to enable multi-bit comparand masking within a comparand mapping circuit.

Comparing the different modes of operation illustrated in FIG. 12, it can be seen that comparand bits are applied individually in the XY mode and as a state-mapped, multi-bit entity in the state mapping mode. Thus, in systems that apply bitwise comparand masks (sometimes referred to as global masking), the XY mode may be selected and the individual comparand bit may be masked, for example, by driving both compare lines of the corresponding compare line pair low during the compare operation, thereby preventing a mismatch indication in the corresponding column of single-bit CAM cells. In the state mapping mode, global masks may be applied on a multi-bit entity basis, for example, to mask out pairs of comparand bits and thereby prevent mismatch indications in a column of multi-bit CAM cells (or CAM cells used to store data maps representative of more than two data/mask bit pairs). FIG. 14 illustrates a mapping sub-circuit 475 that may be used to enable multi-bit comparand masking within a comparand mapping circuit. The mapping sub-circuit 475 includes a 2:4 decoder 465 to decode a two-bit comparand entity $C_1$, $C_0$ into a corresponding one-hot comparand map. The constituent bits of the comparand map are input to respective AND gates 477 and logically ANDed with the complement of an entity mask bit 478 (EM), the complement being effected, for example, by an inverting input of each of the AND gates 477. By this arrangement, when the entity mask bit 478 is in a non-masking state (e.g., a logic '0'), the comparand map passes through the logic AND gates 477 unchanged, and, when the mask entity bit is in a masking state (e.g., logic '1'), the outputs of the AND gates are held low to mask the comparand map. By replicating the mapping sub-circuit 475 at each column position within a CAM device, a global mask value having N/2 mask bits may be applied to selectively mask two-bit comparand entities within an N-bit comparand value.

FIG. 15 is a logic table 500 illustrating the mode-selectable operation of a read mapping circuit according to one embodiment. Referring to FIG. 8, when the mode select signal 342 is in a first state (i.e., logic '0' in this example), a state mapping mode of operation is selected within the read mapping circuit 349, and each set of four data bits read from the CAM array 201 are treated as constituent bits of a data map (i.e., state bits) and mapped to two pairs of data and mask bits in the manner described in reference to FIG. 10. That is, rows 1-9 of table 500 are the same as rows 1-9 in table 400 of FIG. 10. When the mode select signal 342 is in a second state (i.e., logic '1' in this example), an XY mapping mode of operation is selected within the read mapping circuit 349. In the XY mapping mode, each pair of bits stored within the four storage elements of a multi-bit CAM cell is treated as an XY bit pair and mapped to corresponding data and mask bits. In the embodiment of FIG. 15, the data bit and mask bits are generated from the XY bit pair according to the following expressions:

$$D=X, \text{ and}$$

$$M=/X*/Y, \text{where '*' indicates a logical AND operation.}$$

Thus, in rows 10, 12 and 16 of the table 500, $D_0=X_0=$'0' and $M_0=$'0' (because $X_0$ and $Y_0$ are not both low). Similarly, in rows 10, 11, and 14 of the table, $D_1=X_1=$'0' and $M_1=$'0'. In rows 11, 13 and 17, $D_0=X_0=$'1', and $M_0=$'0' (again, because $X_0$ and $Y_0$ are not both low), and in rows 12, 13 and 15, $D_1=X_1=$'1' and $M_1=$'0'. In rows 14, 15 and 18, $X_0$ and $Y_0$ are both low, so that $M_0=$'1', and $D_0=$'0'. Similarly, in rows 16, 17 and 18, $X_1$ and $Y_1$ are both low, so that $M_1=$'1' and $D_1=$'0'. Other read mapping conversions may be performed in alternative embodiments. Also, as discussed in reference to FIG. 10, in the event of a soft error or other failure, the data map stored within or output from a given CAM cell may be corrupted and exhibit a state other than the states shown in table 500. The read mapping circuit 349 may map such invalid data maps to a predetermined data/mask pattern (e.g., all zeroes) or, alternatively, may respond to such invalid states in whatever manner yields the simplest or otherwise desirable combinatorial logic for generating the output data and mask bits. As discussed below, an error detection circuit and/or circuitry within the read mapping circuit may additionally assert an error signal to indicate that a corrupted data map has been read.

Returning to FIG. 8, it should be noted that the read data path 346 and write data path 348 may be the same path, or may feed into and out of a shared path such as a dedicated read/write data bus, or a multiplexed data bus (e.g., used to carry data, comparand, control and/or result values). Also, while the write mapping circuit 347 and read mapping circuit have been described as being included within the read/write logic 343, such circuits may be disposed in other circuit blocks within the CAM device in alternative embodiments (e.g., in an input/output interface of the CAM device). Also, the read and write mapping functions may alternatively be performed by circuitry (including a programmed processor) included within a separate integrated circuit device. For example, a network processor, host processor, ASIC or other integrated circuit device may receive (or generate) read and write data values, perform the logic conversions illustrated in FIGS. 6, 7, 10, 12 and/or 15 (or any other logic conversions described herein), then provide the converted write data values to the CAM device for storage therein, and provide the converted read data values to the requesting device (or other circuitry within the read-mapping device). Similarly, comparand values may be converted to comparand map words by circuitry external to the CAM device, then provided to the CAM device for comparison with state-mapped data values stored therein.

Error Detection

Figure 16:
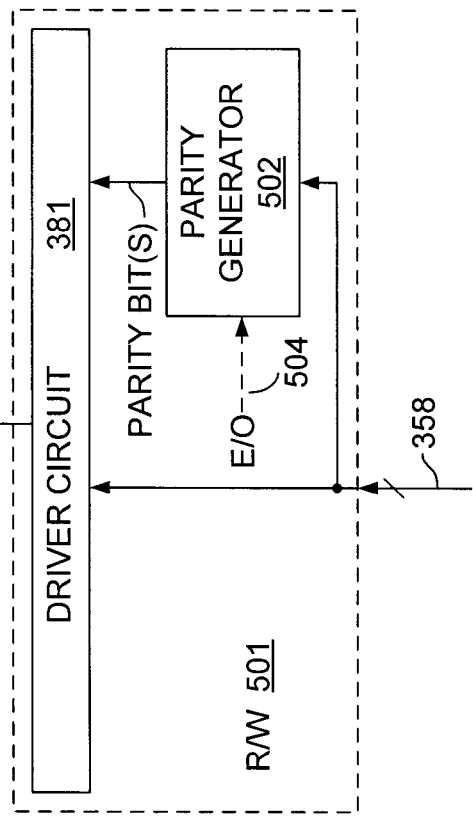
FIG. 16 illustrates an embodiment of a read/write circuit that generates one or more parity bits to be stored in the CAM array along with a selected write word.

FIG. 16 illustrates an embodiment of a read/write circuit 501 that generates one or more parity bits to be stored in the CAM array along with a selected write word 358. The read/write circuit 501 includes a parity generator 502 and a driver circuit 381, each coupled to receive the selected write word 358 from a write data selector (e.g., element 351 of FIG. 8). In one embodiment, the parity generator generates a single parity bit for the selected write word 358, with the parity bit having a state as necessary to achieve even or odd parity (selected, for example, by even/odd control signal 504 which corresponds to a programmable selection within the CAM device). In an alternative embodiment, the parity generator generates multiple parity bits, one per multi-bit segment of the selected write word 358. In either embodiment, the one or more parity bits are supplied to the driver circuit 381 which, in turn, outputs the parity bits and selected write word 358 onto bit lines of the CAM array for storage in an address-selected row of CAM cells.

Figure 17:
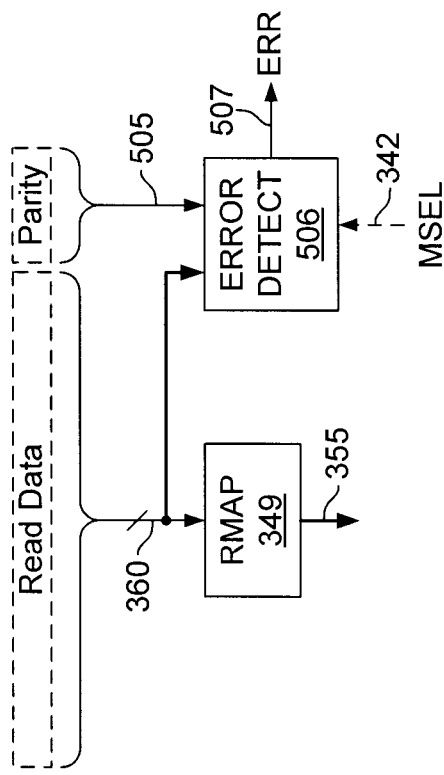
FIG. 17 illustrates an error detection arrangement that may be used in conjunction with the parity-bit-generating read/write circuit of FIG. 16.

FIG. 17 illustrates an error detection arrangement that may be used in conjunction with the parity-bit-generating read/write circuit 501 of FIG. 16. When a map word 360 (or other read data) is read from the CAM array, the corresponding parity bits 505 (which may be a single parity bit) is also retrieved. The map word 360 is input to the read mapping circuit 349 to generate a read value 355 in the manner described in reference to FIG. 8 (a read data selector may also be provided to select either the map word 360 or the read value 355 to be output onto a read data bus) and is also input to an error detect circuit 506 along with the parity bits 505. The error detect circuit 506 generates one or more parity bits based on the map word 360 (e.g., using a parity generator circuit similar or identical to circuit 502 of FIG. 16), then compares the generated parity bits with the stored parity bits 505. If the generated parity bits and stored parity bits do not match, an error signal 507 is generated.

As discussed in reference to FIGS. 6 and 7, seven of the possible four-bit combinations are unused when a state mapping mode of operation is selected within the CAM device. In one embodiment, these unused four-bit combinations are treated as invalid states and, if detected by the error detector 506, used to signal an error. By this operation, supplemental error checking is be achieved within the CAM device, potentially detecting multi-bit errors that would otherwise escape detection within a parity checking circuit. Referring to FIG. 12, it can be seen that a different set of seven four-bit combinations are unused when an XY mapping mode of operation is selected. Accordingly, in one embodiment, the mode select signal 342 (i.e., the signal used to select between state mapping and XY mapping modes) is supplied to the error detect circuit to enable detection of different invalid states according to the selected mapping mode.

Figure 18:
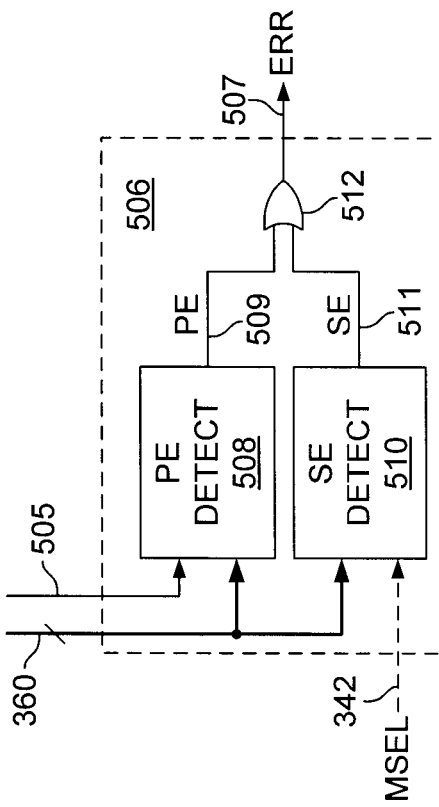
FIG. 18 illustrates an error detect circuit according to an embodiment of the invention.

FIG. 18 illustrates an error detect circuit 506 according to an embodiment of the invention. The error detect circuit 506 includes a parity error detector 508 and state error detector 510. The parity error detector 508 generates one or more parity bits based on the input map word 360 and compares the generated parity bits with stored parity bits 505. If the generated parity bits and stored parity bits 505 do not match, the parity error detector asserts a parity error signal 509. Though not shown in FIG. 18, the parity error detector 508 may also receive an even/odd select signal (e.g., signal 504 of FIG. 16) to enable detection of even or odd parity errors. The state error detector 510 receives the map word 360 and, in a selectable write mapping embodiment, the mode select signal 342. The state error detector 510 determines whether any of the constituent data maps (or XY maps) within the map word 360 match any of the invalid states for the selected mapping mode. If a data map matches an invalid state, then a state error signal 511 is asserted to signal the error condition. In the embodiment of FIG. 18, the parity error signal 509 and state error signal 511 are logically ORed in logic gate 512 to generate the error signal 507. In an alternative embodiment the state error signal 511 and parity error signal 509 may be output separately, for example, to a status register or directly to a host device. Also, because any state error detected within the map word is localized to a data map (or XY map) within the map word 360, the relative bit position within the corresponding two-bit entity (in state mapping mode) or single bit entity (in XY mapping mode) may be signaled by the state error detector 510 to enable the corrupted data map to be overwritten with a corrected data map. Such an error correction operation may be carried out automatically by the CAM device or under host control. More generally, error detection operations may be carried out by systematically reading rows of CAM cells within the CAM array and error checking the contents of each row. If an error is detected, the error may be signaled (e.g., by setting a status bit or by driving an external error signal line) and the address of the row of CAM cells determined to contain an error may be recorded within an error address register for later retrieval by a host device or for use in an automatic correction operation. Also, error checking may be performed in response to a match detection, for example, by routing the match address from priority encoder to address decoder (e.g., routing the match address from priority encoder to address decoder within the CAM device, or to an external device and then back to the CAM device) and thereby enabling the map word at the match address to be read from the CAM array and error checked in the error detect circuit 506. By this operation, each match address may be output along with (or before or after) a qualifying match error signal. If the match error signal is in an error state, the host device (or other match address recipient) is informed that the match address resulted from a match with a corrupted map word and may take appropriate action (e.g., halting the packet forwarding operation otherwise executed in response to the match detection, instructing the CAM device to invalidate or overwrite the corrupted map word and so forth). It should be noted that while parity bit generation and parity error detection has been described in reference to FIGS. 16, 17 and 18, numerous other types of error detection schemes may be used in alternative embodiments including, without limitation, cyclic redundancy checking, checksum checking, and error correction code schemes.

Multi-Bit, Multi-Compare CAM Cell

Figure 19:
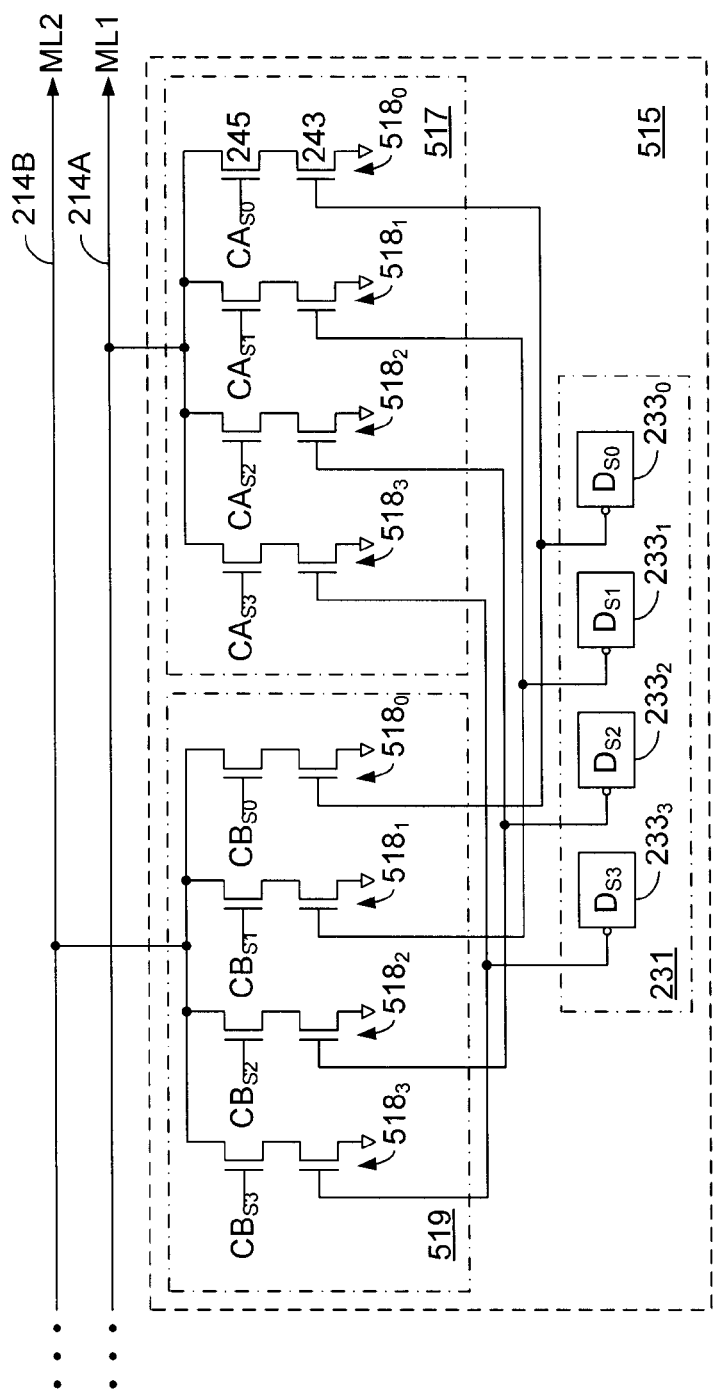
FIG. 19 illustrates a multi-bit, multi-compare CAM cell having a four-bit storage circuit and two compare circuits.

FIG. 19 illustrates a multi-bit, multi-compare CAM cell 515 having a four-bit storage circuit 231 and two compare circuits 517 and 519, each compare circuit being coupled to the storage circuit 231 and to a respective one of match lines 214A and 214B (i.e., ML1 and ML2). Each of the compare circuits 517 and 519 includes four switching circuits $518_0$-$518_3$ formed by respective pairs of series coupled transistors 243 and 245 coupled between a match line (i.e., ML1 or ML2) and a ground reference. Gate terminals of transistors 245 within compare circuit 517 are coupled to a first set of compare lines (not shown) to receive respective state bits $CA_{S0}$-$CA_{S3}$ of a first comparand map, and gate terminals of transistors 245 within compare circuit 519 are similarly coupled to a second set of compare lines (not shown) to receive respective state bits, $CB_{S0}$-$CB_{S3}$, of a second comparand map. As in the embodiments described in reference to FIGS. 2 and 5, each comparand map includes a single hot bit, thereby reducing the power consumed energizing the compare lines in successive compare operations. Gate terminals of transistors 243 within compare circuit 517 are coupled to inverting outputs of respective storage elements, $233_0$-$233_3$, within storage circuit 231. Gate terminals of transistors 243 within compare circuit 519 are similarly coupled to the inverting outputs of the storage elements, $233_0$-$233_3$. By this arrangement, a binary data map (i.e., having a single hot bit) or ternary data map (i.e., having one or more hot bits according to masked states in the input data/mask entity) may be compared simultaneously or in pipelined fashion with two different comparand maps presented on the respective sets of compare lines. The match results for each of the two compare operations are signaled on match lines 214A and 214B, respectively, which may be supplied, for example, to separate priority encoders and flag circuits, or time multiplexed (e.g., using a multiplexer) at the input of a single priority encoder and flag circuit. It should be noted that, although the switching circuits $518_0$-$518_3$ are depicted as being disposed in groups according to the compare circuit to which they belong, the switching circuits $518_0$-$518_3$ may alternatively be disposed according to their interconnections to compare lines and/or storage elements within the storage circuit 231. For example, in one embodiment, the switching circuits designated $518_0$ and coupled to storage element $233_0$ are disposed adjacent one another, the switching circuits designated $518_1$ and coupled to storage element $233_1$ are disposed adjacent one another, and so forth. Also, while two compare circuits and two match lines are illustrated in FIG. 19, any number of compare circuits and match lines may be provided in alternative embodiments to increase the number of simultaneous or pipelined compare operations that may be performed.

Figure 20:
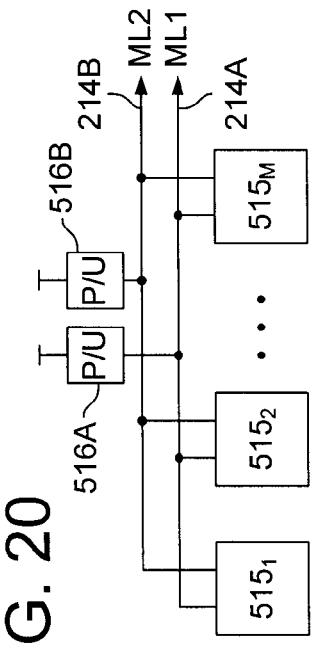
FIG. 20 illustrates a row of multi-bit, multi-compare CAM cells coupled to a pair of match lines according to one embodiment.

In one embodiment, illustrated in FIG. 20, match lines 214A and 214B (ML1 and ML2) are each coupled to a row of multi-bit, multi-compare CAM cells $515_1$-$515_M$ and are pulled up to a supply voltage or other reference voltage through respective pull-up circuits 516A and 516B. Accordingly, if any one of the ML1-connected compare circuits within the row of CAM cells $515_1$-$515_M$ (i.e., compare circuits 517 of FIG. 19) detects a mismatch condition, the compare circuit will pull match line 214A low to signal the mismatch. Similarly, if any one of the ML2-connected compare circuits (i.e., compare circuits 519 of FIG. 19) within the row of CAM cells $515_1$-$515_M$ detects a mismatch condition, the compare circuit will pull match line 214B low to signal the mismatch. If no mismatch is signaled by the compare circuits coupled to a given match line 214A or 214B, then the match line remains pulled up to signal the match condition.

Figure 21:
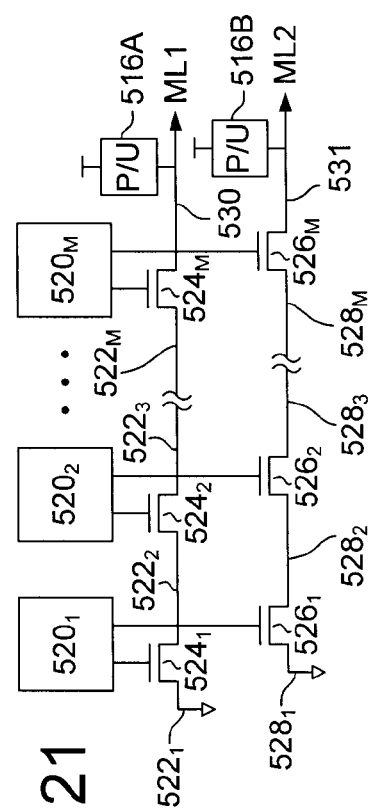
FIG. 21 illustrates a row of multi-bit, multi-compare CAM cells coupled to a pair of match lines according to another embodiment.

FIG. 21 illustrates a match line arrangement according to an alternative embodiment. Each of the match lines ML1 and ML2 is formed by a respective set of match line segments $522_1$-$522_M$ and $528_1$-$528_M$ coupled to one another via a corresponding set of switching transistors $524_1$-$524_M$ and $526_1$-$526_M$ to form a switchably controlled path between the match line output 530 and 531 and a reference voltage node (ground in this embodiment). Referring to match line, ML1, for example, if all the switching transistors $524_1$-$524_M$ are switched on, a path is completed between the ML1 output 530 and ground to signal a match condition. The match line output 530 is pulled up to a reference voltage by a precharge circuit 516A so that, if one or more of the switching transistors $524_1$-$524_M$ is switched off, the path to ground is interrupted and the match line output 530 remains high to signal a mismatch condition. Similarly, if all the switching transistors $526_1$-$526_M$ of ML2 are switched on, a path is completed between the ML2 output 531 and ground to signal a match condition. As with match line output 530, match line output 531 is pulled up by a precharge circuit 516B so that, if one or more of the switching transistors $526_1$-$526_M$ are switched off, the path to ground is interrupted and the match line output 531 remains high to signal a mismatch condition.

In the embodiment of FIG. 21, negative-type MOS (NMOS) transistors 524 and 526 are used to interconnect match line segments $522_1$-$522_M$ and $528_1$-$528_M$, and the CAM cells $520_1$-$520_M$ each generate logic high outputs to signal a match condition. In one embodiment, the CAM cell 515 of FIG. 19 is modified to achieve this result by coupling the gate terminals of transistors 243 (i.e., within switching circuits 518) to non-inverting outputs of the storage elements $233_0$-$233_3$ rather than inverting outputs, and by coupling the source terminals of the transistors 243 to a supply voltage reference node instead of the ground reference node. In an alternative embodiment, positive-type MOS (PMOS) transistors may be used in place of the NMOS transistors 524 and 526 depicted in FIG. 21. In such an embodiment, the PMOS transistors are switched on in response to logic low match indications so that the reference voltage nodes 412 and 414 within the CAM cell 380 of FIG. 6 may remain coupled to ground, and the constituent bits of the stored data map may be complemented (e.g., by coupling the gate terminals of the transistors 243 to non-inverting outputs of storage elements 233) to generate logic low match indications. It should be noted that the alternative match line arrangement illustrated in FIG. 21 is not limited to multiple match line embodiments, but rather may be used in any of the embodiments described herein, including embodiments in which only one match line is coupled to each row of CAM cells.

CAM Device as a Bitwise-Programmable Arithmetic Logic Unit

As discussed in reference to the logic table 320 of FIG. 6, only nine of the sixteen possible 4-bit combinations are needed to represent all the possible data maps in a state mapped, ternary CAM embodiment. Upon reflection, it can be seen that the unused 4-bit combinations may be interpreted as a bitwise logic operation to be performed on the constituent bits of a two-bit comparand entity. That is, the constituent bits of comparand entity CE[1:0] may be viewed as bitwise operands, A and B, and each of the seven unused 4-bit combinations as expressing a different Boolean operation to be performed on the bitwise operands. Extending this observation, it can be seen that the sixteen possible 4-bit combinations correspond to the sixteen possible Boolean operations that can be performed on two bitwise operands. Thus, the different data map states express different Boolean operation to be performed on the bitwise operands A and B.

FIG. 22 is a logic table 540 illustrating selective operation of the CAM device of FIG. 8 as either a state-mapped ternary CAM (including optional mode selectable XY operation) for comparing N-bit comparand values with contents of the CAM array, or as a bitwise arithmetic logic unit for performing programmable, bitwise Boolean operations on two multi-bit operands A[M:0] and B[M:0], where M=N/2. Thus, in rows 1-9 of the table 540, the bypass signal (i.e., signal 344 in FIG. 8) is low, thereby causing an input data/mask entity DM[3:0] to be mapped to a data map as described above in reference to FIG. 7. As discussed, XY mapping may alternatively be selected in a selective mapping-mode embodiment. In rows 10-25 of the table, the bypass signal is asserted so that any of the sixteen possible 4-bit combinations may be input directly to the CAM device to effect corresponding bitwise Boolean operations. The Boolean operations are shown as bitwise combinations variables A and B, and the corresponding match line output (i.e., Boolean result) is shown for each of the possible input comparand bit patterns (i.e., bitwise operands A and B being represented by CE[1] and CE[0], respectively). Thus, by providing different values of the data/mask entity to be stored in different columns of CAM array, different bitwise Boolean operations are, in effect, programmed into the CAM array and thereafter performed on the constituent bits of multi-bit input values A[M:0] and B[M:0]. For example, an expression such as "(A[0]* B[0])*(A[1]⊕B[1]) *(A[2] +B[2])* . . . *(/A[M-1])" may be evaluated by storage of the indicated AND ('*'), exclusive-OR ('⊕'), OR ('+') and NOT ('/') operators in respective multi-bit CAM cells of a CAM row. Thus, virtually any combination of bitwise operations may be programmed within the CAM array and performed on constituent bits of multi-bit input values. Though bitwise Boolean combinations of two variables are illustrated in table 540, additional state bits may be provided in alternative embodiments to enable virtually any bitwise Boolean combinations of three or more variables.

Multi-Block State-Mapping CAM Device

Figure 23:
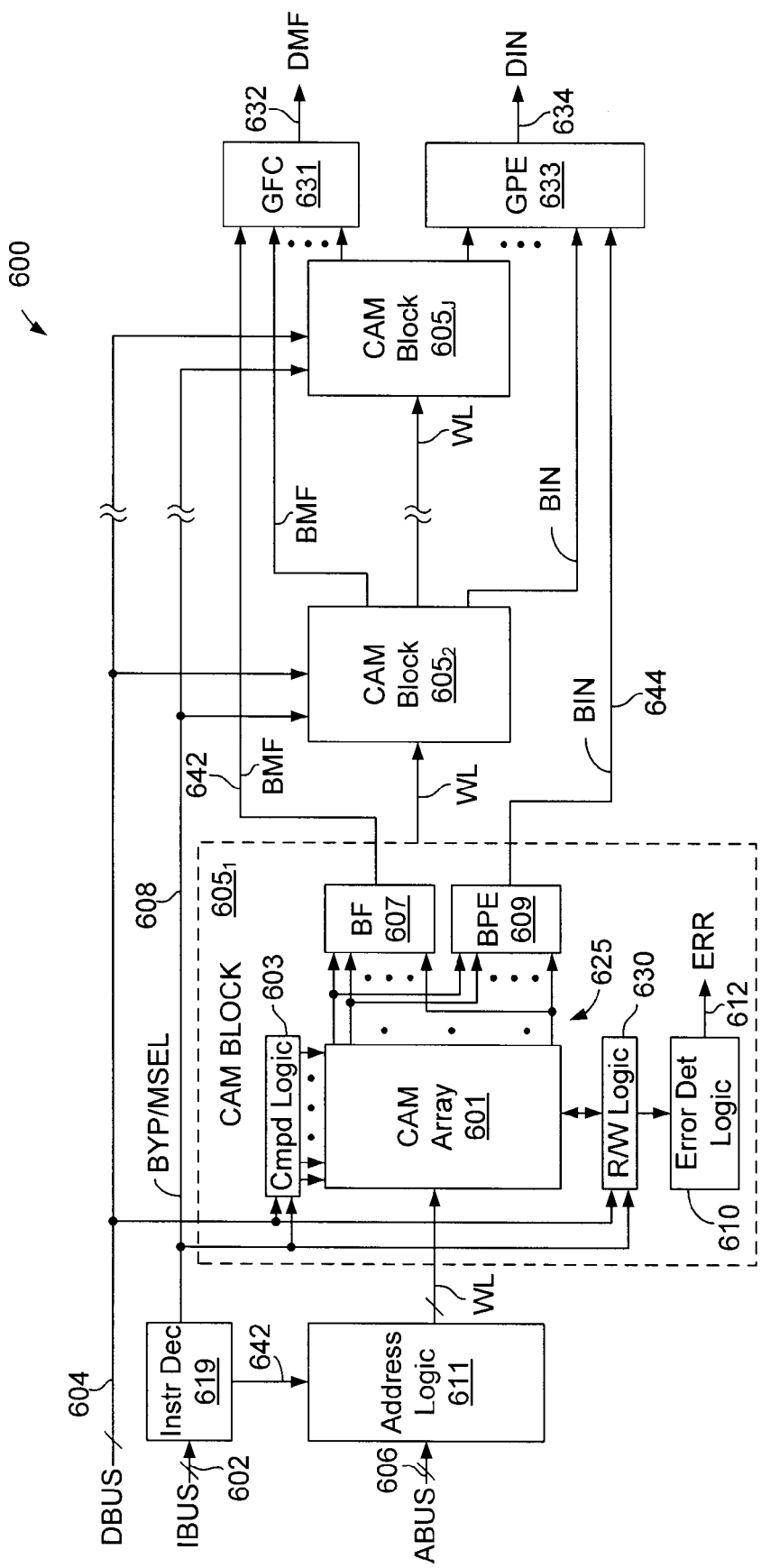
FIG. 23 illustrates a CAM device having state-mapping comparand logic and state-mapping read/write logic according to an embodiment of the invention.

FIG. 23 illustrates a CAM device 600 having state-mapping comparand logic and state-mapping read/write logic according to an embodiment of the invention. The CAM device 600 may be implemented in a dedicated integrated circuit (IC) device or as a portion of an IC device (or IC package) that includes other circuit blocks or features, such as a general or special purpose processor (e.g., network processor or digital signal processor), microcontroller, memory controller, and so forth. In the embodiment of FIG. 23, the CAM device 600 includes multiple independently selectable CAM blocks, $605_1$-$605_j$, instruction decoder 619, address logic 611, global flag circuit 631 (GFC) and global priority encoder 633 (GPE). A number of other circuit blocks, not shown, may also be included within the CAM device 600 including, without limitation, input/output drivers, status registers, configuration circuits, associated storage, and so forth. As shown in the detail view of CAM block $605_1$, each of the CAM blocks 605 includes a CAM array 601, block flag circuit 607 (BF), block priority encoder 609 (BPE), state mapping comparand logic 603, state-mapping read/write logic 630, and error detection logic 610. The CAM array 601 may include columns of multi-bit CAM cells each arranged as described in reference to FIG. 3, and coupled to receive comparand maps and data maps from compare lines and bit lines, respectively. As discussed, a separate pair of bit lines may be provided for each storage element within a multi-bit CAM cell, or bit lines may be time multiplexed with write and read operations being performed in a sequence of component write and read operations. Also, the CAM cells may be used to store and compare state-mapped comparand and data entities having more than two constituent bits. The comparand logic is implemented as described in reference to FIGS. 2 and 5, or alternately, may generate comparand maps representative of comparand entities having three or more constituent bits. Similarly, the read/write logic may be implemented as described in reference to FIGS. 2, 5, and 8 or, alternatively, may perform write and read mapping operations for write and read data entities having three or more constituent bits.

Instructions such as read, write and compare instructions are issued to the CAM device 600 by a host processor, network processor or other control device (not shown) via an instruction bus 602. In the case of read and write instructions, the control device may additionally issue address values to the CAM device 600 via address bus 606 to specify storage locations to be accessed in the CAM array 601. The instruction decoder 619 responds to instructions received via the instruction bus 602 by signaling other circuit blocks within the CAM device 600 to perform the instructed operation, including issuing control signals to control the comparand mapping and read/write mapping operations described in reference to FIGS. 8-15, and/or the arithmetic logic function described in reference to FIG. 22. The address logic 611 receives addresses from the address bus 606 as well as from address sources within the CAM device 600 including, without limitation, a next free address (NFA) register that indicates a highest priority, unoccupied location within a CAM array; a highest priority match (HPM) register that contains a match address generated after a compare operation within the CAM device; an error check register that contains an address of a storage location within a given CAM array (or all the CAM arrays) to be error-checked (e.g., for parity error, cyclic redundancy check error, error correction code error, or other error); and any other desirable source of addresses. During a read or write access to a CAM array 601 within one of CAM blocks 605, the address source is selected by the address logic 611 in response to one or more control signals 642 from the instruction decoder 619 (or other control circuitry), and decoded by the address logic 611 to activate a word line (or combination of group and row word lines as in FIG. 11) that corresponds to a selected row of CAM cells within the CAM array 601. State-mapped read and write operations are then carried out in the manner described above in reference to FIGS. 2, 5 and 8. In one embodiment, a host requested read operation is carried out by activating an address-selected word line (or combination of group and row word lines) that extends across the CAM arrays in all or a portion of the CAM blocks. A block address field of the address is used to enable the sense amplifier circuits within one of the CAM blocks, thereby resolving the overall read operation to a particular row of CAM cells (or portion thereof) within a particular CAM block 605. During an error checking operation, the sense amplifiers within all the CAM blocks $605_1$-$605_j$ (i.e., within the read/write circuits 615) may be enabled concurrently (i.e., at least partly overlapping in time) and the bypass signal asserted as discussed in reference to FIGS. 8 and 11 to enable map words containing constituent data maps and corresponding error check values to be read from the same row location within each CAM array 601 in each CAM block 605, and checked for error in a respective error detection circuit 610. Because separate compare lines and bit lines are provided within each of the CAM arrays 601, such error checking operations may be executed without interrupting (or interfering with) the stream of compare operations executed within the CAM device 600.

In one embodiment, the error detection circuit 610 includes a parity checking circuit that generates one or more parity bits based on the content of the map word read from the CAM array 601, then compares the generated parity bits to parity bits included in or with the map word read from the CAM array. As discussed above, the parity bits may be generated based the map value at the time the map value is stored within the CAM array. If the generated parity bits do not match the stored parity bits, the error may be signaled by assertion of an error signal 612 (ERR) and/or by recording an error status in the status register of the CAM device 600. As discussed above, an error signal may also be generated if a constituent data map of the map word read from the CAM array has an illegal state (e.g., more than one bit hot in a binary embodiment, or one of the seven unused states in a ternary embodiment), thus enabling detection of errors that might otherwise go undetected in a parity checking operation. The address from which the CAM word in error was read may be stored in a register for later access by the host processor, network processor or other control device. The error detection circuit 610 may perform a parity error check, cyclic redundancy check, checksum check, syndrome check (e.g., a syndrome generated from an error correction code) or any other type of error checking operation.

In the embodiment of FIG. 23, the comparand logic 603 within each of the CAM blocks 605 includes a comparand register to store a comparand value received via a data bus 604, comparand mapping logic to generate a corresponding comparand map word (i.e., having constituent comparand maps), and compare line drivers to drive the comparand map word onto compare lines of the corresponding CAM array 601. Alternatively, the comparand register may be omitted and the comparand value may be supplied to the comparand mapping circuitry directly from the data bus 604. Also, the comparand mapping logic may be disposed before or after the comparand register in the comparand path. For example, in one embodiment, the comparand mapping logic generates a comparand map word based on an incoming comparand value, and outputs the comparand map word to a comparand register for later output onto the compare lines of the CAM array 601. Alternatively, the comparand register may be used to store the incoming comparand value, and output the comparand value to the comparand mapping logic to generate the comparand map word. Comparand logic circuits 603 within the different CAM blocks 605 may be provided with the same or different comparand values and may be enabled to drive the comparand values onto the compare lines of the corresponding CAM arrays 601 simultaneously, or in pipelined fashion. Also, in a selective comparand mapping embodiment (e.g., selection between multi-bit state mapping and XY mapping), the comparand logic circuits 603 within the different CAM blocks 605 may be configured to apply different mapping schemes (e.g., XY mapping in one block, state mapping in another). In other embodiments, one or more of the CAM blocks $605_1$-$605_j$ may have a filter circuit that is programmable to selectively provide, as the comparand for the associated CAM array 601, one or more bits or fields of a comparand value provided to the CAM device 600. The filter circuit may be, for example, a cross-bar switch circuit. Other types of filter circuits may be used in alternative embodiments. Within each CAM block 605, compare results generated within the CAM arrays 601 are output via match lines 625 to the block flag circuit 607 and block priority encoder 609. The block flag circuit 607 outputs a block match flag signal 642 to indicate whether a match has been detected in the corresponding CAM array 601, and may additionally output a multiple match flag signal (not shown) to indicate whether multiple matches have been detected within the CAM array 601. The block priority encoder 609 outputs a block index 644 (i.e., an address value) that corresponds to the CAM array location containing the highest priority CAM word determined to match the comparand value. CAM word priority may be programmable within individual CAM blocks and/or from CAM block to CAM block. Alternatively, CAM word priority may be fixed within CAM blocks (e.g., according to a predetermined priority policy such as an address-dependent priority policy) and/or from CAM block to CAM block. The block match flags from each of the CAM blocks $605_1$-$605_j$ are input to a global flag circuit 631 which generates a device match flag signal 632 according to whether any matches were detected in the CAM device 600. As with the block flag circuit 607, the global flag circuit 631 may also output a device multiple match flag signal to indicate whether multiple matches were detected in the CAM device 600. The block indices 644 generated by the CAM blocks $605_1$-$605_j$ are input to a global priority encoder 633 which determines a highest priority one of the block indices 644 and outputs a corresponding device index 634. The device index 634 includes the highest priority one of the block indices 644 together with a block address segment that identifies the CAM block 605 that sourced the highest priority block index. In one embodiment, the block priority encoder 609 within each CAM block 605 outputs a predetermined "no-match" code when none of the match signals 625 is asserted. The global priority encoder 633, in turn, treats the no-match code is as having a lowest of all possible priorities, so that a match detected within any of the CAM blocks will result in selection of the corresponding block index over the no-match code. In an alternative embodiment, the block match flags 642 are provided to the global priority encoder 633 along with the block indices 644. If a block match flag 642 is deasserted (i.e., to indicate that no match was detected within the corresponding CAM block 605), then the block index 644 from the same CAM block 605 is eliminated as a source of the block index portion of the device index 634.

In one embodiment, each device index 634 (or each device index for which the corresponding device match flag 632 is asserted) is supplied to the address logic 611 and used to read the corresponding map word from the indicated storage location (i.e., from a specified row of the CAM array 601 within a specified one of CAM blocks $605_1$-$605_j$) for error checking purposes. If an error is detected by the error detection circuit 610, then a qualifying error signal 612 is output from the CAM device along with the device index 634, to inform the host processor, network processor or other control device that the device index (i.e., the match address) resulted from a match with a corrupted map word. Although output latency is increased by such error checking, the error checking operation may be executed concurrently with a subsequent compare operation, so that compare and error checking operations are effectively pipelined to maintain the compare throughput of the CAM device.

Although the CAM device of FIG. 23 includes multiple CAM blocks, this is not required. In alternative embodiments, CAM devices having single CAM blocks may include the comparand mapping circuitry and read and write mapping circuitry described in reference to FIGS. 2-17. Also, in one embodiment, the data bus 604 is used to transmit write and read data to and from the CAM device 600 (i.e., in addition to delivering comparand values) and is therefore coupled to the read/write circuit 615 within each CAM block. In alternative embodiments, one or more of the address, instruction and data buses may be eliminated and the corresponding signals time multiplexed onto the remaining bus or buses. Also, each of the CAM blocks may be programmed to store and generate comparison results for one, two or more CAM words per row of CAM cells, in effect, enabling a programmable storage width and depth within the CAM block.

Aspects of various embodiments disclosed herein are set forth, for example and without limitation, in the following numbered clauses:

1. A content addressable memory (CAM) device comprising:
   a plurality of columns of CAM cells; and
   a plurality of decoder circuits to decode respective groups of bits of a comparand value into corresponding sets of decoded signals, and coupled to provide each of the sets of decoded signals to a respective one of the columns of CAM cells.
2. The CAM device of claim 1 wherein each group of bits includes M constituent bits and each corresponding set of decoded signals includes N constituent signals, N being greater than M.
3. The CAM device of claim 2 wherein $N=2^M$.
4. The CAM device of claim 1 wherein each of the groups of bits of the comparand value includes two constituent bits and each corresponding set of decoded signals includes four constituent signals.
5. The CAM device of claim 1 wherein each of the plurality of decoder circuits decodes the respective group of bits of the comparand value into the corresponding set of decoded signals such that one signal of the set of decoded signals has a first state and the remaining signals of the set of decoded signals have a second state.
6. The CAM device of claim 5 wherein the one signal having the first state is a first, second, third or fourth one of the decoded signals according to whether the corresponding group of bits of the comparand value have a first, second, third or fourth state, respectively.

7. The CAM device of claim 1 further comprising a plurality of mapping sub-circuits to convert respective groups of bits of a write data value into corresponding sets of data state signals, the mapping sub-circuits being coupled to provide the sets of data state signals to the columns of CAM cells, respectively.

8. The CAM device of claim 7 wherein the write data value comprises:
a data word having constituent data bits; and
a mask word having constituent mask bits, and wherein the each of the mapping sub-circuits is configured to convert a respective group of the data bits and a respective group of the mask bits into the corresponding set of data state signals.

9. The CAM device of claim 7 wherein each of the sets of data state signals is a set of complementary signals.

10. The CAM device of claim 7 wherein each of the sets of data state signals includes N signals in a first state and M minus N signals in a second state, N ranging from one to M and being the number of permutations of a first group of bits of a comparand value that match a corresponding one of the groups of bits of the write data value.

11. The CAM device of claim 10 wherein the number of permutations of the first group of bits of a comparand value that match the corresponding one of the groups of bits of the write data value is one (1) if no mask bits included within the corresponding one of the groups of bits of the write data value indicate a mask condition.

12. The CAM device of claim 10 wherein the number of permutations of the first group of bits of a comparand value that match the corresponding one of the groups of bits of the write data value is $2^R$, R being the number of mask bits included within the corresponding one of the groups of bits of the write data value that indicate a mask condition.

13. A content addressable memory (CAM) device comprising:
an array of CAM cells;
a write mapping circuit to convert an input data word into a converted data word having one of at least two different patterns of constituent bits according to the state of a first control signal; and
a read/write circuit coupled to receive the converted data word from the write mapping circuit and coupled to the array of CAM cells to output the converted data word thereto.

14. The CAM device of claim 13 wherein the two different patterns of bits comprise equal numbers of bits.

15. The CAM device of claim 13 wherein the input data word includes data bits and mask bits with each of the data bits and mask bits constituting a respective data/mask bit pair, and wherein each set of four bits within the converted data word includes $2^R$ bits in a first state and the remaining bits in a second state if the first control signal selects a first conversion mode, R being the number of mask bits in a masking state within a group of two data/mask bit pairs.

16. The CAM device of claim 15 wherein each set of four bits within the converted data word includes R−2 bits in a first state and the remaining bits in a second state if the first control signal selects a second conversion mode.

17. The CAM device of claim 16 wherein the converted data word is complemented prior to being stored within the array of CAM cells if the first control signal selects the second conversion mode.

18. The CAM device of claim 15 wherein the converted data word is complemented prior to being stored within the array of CAM cells if the first control signal selects the first conversion mode.

19. The CAM device of claim 13 further comprising a write data selector having a first input port coupled to receive the converted data word from the write mapping circuit and a second input port coupled to receive the input data word, the write data selector being responsive to a second control signal to output either the converted data word or the input data word to the read/write circuit.

20. The CAM device of claim 13 further comprising a read mapping circuit coupled to receive a read data word from the read/write circuit and configured to convert the read data word into a converted data word having one of at least two different patterns of constituent bits according to the state of the first control signal.

21. A method of operation within a content addressable memory (CAM) device, the method comprising:
decoding respective pairs of bits within a comparand value into corresponding four-bit map values in which one bit is in a first state and the remaining three bits are in a second state; and
outputting each of the map values onto a respective set of four compare lines within the CAM device.

22. The method of claim 21 further comprising storing the comparand value in a comparand register prior to decoding the respective pairs of bits.

23. The method of claim 21 further comprising storing the map values in a comparand register prior to outputting the map values onto respective sets of compare lines.

24. The method of claim 21 further comprising selecting either a first operating mode or a second operating mode within the CAM device, and wherein decoding respective pairs of bits within a comparand value into corresponding four-bit map values comprises decoding the respective pairs of bits within the comparand value into corresponding four-bit map values if the first operating mode is selected.

25. The method of claim 24 further comprising outputting each bit of the comparand value in complementary form onto a respective pair of the compare lines within the CAM device if the second operating mode is selected.

26. A method of operation within a content addressable memory (CAM) device, the method comprising:
receiving an N-bit comparand value; and
activating less than N compare lines within the CAM device to compare each of the N bits of the comparand value with contents of CAM cells coupled to the N compare lines.

27. The method of claim 26 further comprising converting the N-bit comparand value into a 2N-bit compare word in which each group of four bits includes one bit in a first state and three bits in a second state.

28. The method of claim 27 wherein activating less than N compare lines within the CAM device comprises activating a selected compare line within each set of four compare lines, the selected compare line corresponding to the one bit in the first state.

29. The CAM device of claim 28 wherein activating the selected compare line comprises outputting a logic high signal on the selected compare line.

30. The method of claim 27 wherein converting the N-bit comparand value into a 2N-bit compare word comprises decoding each pair of bits in the comparand value into respective groups of four bits in which each group of four bits includes the one bit in the first state and the three bits in the second state.

31. The method of claim 26 further comprising:
receiving a 2N-bit write value containing N data bits and N mask bits, each of the mask bits corresponding to a respective one of the data bits to form a data/mask pair; and
converting each distinct group of four bits within the write value into a corresponding four-bit map value having $2^R$ bits in a first state and remaining bits in a second state, R being the number of mask bits in the distinct group of four bits within the write value that are in a masking state.

32. The method of claim 31 wherein each distinct group of four bits within the write value includes two mask bits and two data bits.

33. The method of claim 31 further comprising outputting the map value onto a set of bit lines for storage within a CAM cell within the CAM array.

34. A method of operation within a content addressable memory (CAM) device, the method comprising:
converting a four-bit write data entity containing two mask bits and two data bits into a four-bit data map value having $2^R$ bits in a first state, R being the number of mask bits in the write data entity that indicate a masking condition; and
providing a complement of the data map value to a compare circuit within a CAM cell.

35. The method of claim 34 further comprising:
converting a two-bit comparand entity into a four-bit comparand map value having one bit in the first state and remaining bits in a second state; and
providing the comparand map value to the compare circuit.

36. The method of claim 35 further comprising comparing the comparand map value with the complement of the data map value within the compare circuit.

37. The method of claim 36 wherein comparing the comparand map value with the complement of the data map value comprises providing the four-bits of the complement of the data map value to first inputs of respective switching circuits within the compare circuit and providing the four-bits of the comparand map value to second inputs of the respective switching circuits.

38. The method of claim 37 wherein each of the switching circuits within the compare circuit is switched to a conducting state if the bits of the complement of the data map value and the comparand map value are both in the first state.

39. The method of claim 37 wherein each of the switching circuits are coupled between a first match line and a reference node.

40. A content addressable memory (CAM) device comprising:
a CAM array having a plurality of columns of CAM cells;
means for decoding respective pairs of bits within a comparand value into corresponding four-bit map values in which one bit is in a first state and the remaining three bits are in a second state; and
means for outputting each of the map values to a respective one of the columns of the CAM cells.

41. A content addressable memory (CAM) device comprising:
a CAM array having a plurality of CAM cells and 2N compare lines, N being an integer value;
means for receiving an N-bit comparand value; and
means for activating less than N of the 2N compare lines within the CAM device to compare each of the N bits of the comparand value with contents of CAM cells coupled to the 2N compare lines.

42. The CAM device of claim 41 further comprising means for converting the N-bit comparand value into a 2N-bit compare word in which each group of four bits includes one bit in a first state and three bits in a second state.

43. The CAM device of claim 42 wherein activating less than N of the 2N compare lines comprises means for activating a selected compare line within each set of four compare lines, the selected compare line corresponding to the one bit in the first state.

44. A content addressable memory (CAM) device comprising:
a CAM cell including a storage circuit and a compare circuit;
means for converting a four-bit write data entity containing two mask bits and two data bits into a four-bit data map value having $2^R$ bits in a first state, R being the number of mask bits in the write data entity that indicate a masking condition; and
means for providing a complement of the data map value to the compare circuit.

45. The CAM device of claim 44 further comprising:
means for complementing the data map value to generate the complement of the data map value; and
means for storing the complement of the data map value in the storage circuit.

46. The CAM device of claim 44 further comprising means for storing the data map value in the storage circuit, and wherein the storage circuit comprises means for providing the complement of the data map value to the compare circuit.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A method of operation within a content addressable memory (CAM) device, the method comprising:
storing, in a first row of CAM cells, a first value that indicates respective Boolean operations to be performed within each of the CAM cells of the first row;
simultaneously combining respective pairs of operands within the respective CAM cells of the first row according to the respective Boolean operations indicated by the first value to generate a plurality of logic signals; and
generating an output signal in either a first state or a second state according to whether all the plurality of logic signals have the first state.

2. The method of claim 1 further comprising storing, in a second row of CAM cells, a second value that indicates respective Boolean operations to be performed within each of the CAM cells of the second row, wherein the second value is different than the first value.

3. The method of claim 2 further comprising performing the respective Boolean operations indicated by the first value in the first row of CAM cells concurrently with the respective Boolean operations indicated by the second value in the second row of CAM cells.

4. The method of claim 1 wherein the first value comprises a plurality of multi-bit data entities, each of the plurality of multi-bit data entities having a bit pattern that indicates one of the respective Boolean operations.

5. The method of claim 4 wherein a first bit pattern indicates a first Boolean operation and wherein a second bit pattern indicates a second Boolean operation.

6. The method of claim 1 wherein generating an output signal in either a first state or a second state comprises discharging a precharged match line if at least one of the plurality of logic signals is in the second state.

7. The method of claim 1 further comprising providing the respective pairs of operands to the respective CAM cells from two or more multi-bit input values prior to simultaneously combining the respective pairs of operands, each of the two or more multi-bit input values providing a respective operand of the respective pairs of operands.

8. The method of claim 1 further comprising selecting a first mode of operation of the CAM device if a bypass signal is not asserted and selecting a second mode of operation of the CAM device if a bypass signal is asserted.

9. The method of claim 8 further comprising converting the bits of the first value to data state signals if the first mode of operation is selected.

10. The method of claim 8 wherein the first value indicates the respective Boolean operations to be performed within each of the CAM cells of the first row if the second mode of operation is selected.

11. The method of claim 1 wherein each of the plurality of logic signals is either in a first state or a second state according to whether the respective Boolean operations performed on each of the respective pairs of operands evaluates to true or false respectively.

* * * * *